United States Patent
Kawashima et al.

(10) Patent No.: US 12,413,199 B2
(45) Date of Patent: Sep. 9, 2025

(54) ACOUSTIC WAVE DEVICE, FILTER, MULTIPLEXER, AND MANUFACTURING METHOD OF ACOUSTIC WAVE DEVICE

(71) Applicant: TAIYO YUDEN CO., LTD., Tokyo (JP)

(72) Inventors: Tasuku Kawashima, Tokyo (JP); Mamoru Ishida, Tokyo (JP); Ryo Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 286 days.

(21) Appl. No.: 17/956,481

(22) Filed: Sep. 29, 2022

(65) Prior Publication Data
US 2023/0095992 A1 Mar. 30, 2023

(30) Foreign Application Priority Data

Sep. 30, 2021 (JP) .................................. 2021-161094
Aug. 31, 2022 (JP) .................................. 2022-138121

(51) Int. Cl.
*H03H 9/02* (2006.01)
*H03H 3/02* (2006.01)
*H03H 9/17* (2006.01)

(52) U.S. Cl.
CPC .......... *H03H 9/02086* (2013.01); *H03H 3/02* (2013.01); *H03H 9/173* (2013.01); *H03H 2003/021* (2013.01); *H03H 2003/023* (2013.01)

(58) Field of Classification Search
CPC ...... H03H 9/02086; H03H 3/02; H03H 9/173; H03H 2003/021; H03H 2003/023; H03H 9/02157

(Continued)

(56) References Cited

U.S. PATENT DOCUMENTS

| | | | |
|---|---|---|---|
| 2006/0103492 A1* | 5/2006 | Feng ................. | H03H 9/02118 333/187 |
| 2007/0210878 A1 | 9/2007 | Yamaguchi et al. | |

(Continued)

FOREIGN PATENT DOCUMENTS

| | | |
|---|---|---|
| JP | 2008-42871 A | 2/2008 |
| JP | 2020-88680 A | 6/2020 |

(Continued)

OTHER PUBLICATIONS

Ting Wu et al., "Application of Free Side Edges to Thickness Shear Bulk Acoust ic Resona tor on Lit hium Niobate for Suppression of Transverse Resonances", Materials of the Se cond Res earch Meeting of a coustic Wave Element Technology Consortium, Mar. 8, 2021 (Mentioned in paragraph Nos. 3 and 5 of the application.).

*Primary Examiner* — Jorge L Salazar, Jr.
(74) *Attorney, Agent, or Firm* — CHEN YOSHIMURA LLP

(57) ABSTRACT

An acoustic wave device includes a substrate, lower and upper electrodes provided over the substrate, a piezoelectric film that is provided over the substrate, is interposed between the lower and upper electrodes, and has a pair of through holes that sandwich a resonance region therebetween in a first direction, are provided along the resonance region, and are connected to an air gap that is formed between the substrate and the lower electrode and overlaps the resonance region in the plan view, the lower and upper electrodes overlapping across the piezoelectric film in the resonance region, and additional films that are not provided in a central region of the resonance region in the plan view and are provided in respective edge regions, which are located on respective sides of the central region in a second direction substantially orthogonal to the first direction in the plan view, of the resonance region.

9 Claims, 18 Drawing Sheets

(58) Field of Classification Search
USPC .......................................... 333/133, 186–188
See application file for complete search history.

(56) References Cited

U.S. PATENT DOCUMENTS

| | | | | |
|---|---|---|---|---|
| 2014/0354110 | A1* | 12/2014 | Araki | ........................ H03H 3/02 |
| | | | | 310/311 |
| 2019/0393862 | A1* | 12/2019 | Okada | ..................... H03H 9/177 |
| 2020/0169245 | A1 | 5/2020 | Matsuda et al. | |
| 2022/0014167 | A1* | 1/2022 | Kadota | .............. H03H 9/02157 |

FOREIGN PATENT DOCUMENTS

| | | |
|---|---|---|
| JP | 2020-202465 A | 12/2020 |
| JP | 2020-205533 A | 12/2020 |

\* cited by examiner

ACOUSTIC WAVE DEVICE, FILTER, MULTIPLEXER, AND MANUFACTURING METHOD OF ACOUSTIC WAVE DEVICE

FIELD

A certain aspect of the present disclosure relates to an acoustic wave device, a filter, a multiplexer, and a manufacturing method of an acoustic wave device.

BACKGROUND

As filters and duplexers for high frequency circuits of wireless terminals such as mobile phones, filters and duplexers using piezoelectric thin film resonators are known. The piezoelectric thin film resonator includes a piezoelectric film, and a lower electrode and an upper electrode sandwiching the piezoelectric film therebetween. The region where the lower electrode and the upper electrode are opposite to each other across the piezoelectric film is a resonance region where the acoustic wave resonates.

In the piezoelectric thin film resonator, when an acoustic wave is reflected at the periphery of the resonance region and a standing wave is formed in the resonance region, it becomes an unnecessary spurious emission. Therefore, it is known to reduce spurious emissions by forming an additional film in an edge region within the resonance region as disclosed in for example, Japanese Patent Application Laid-Open Nos. 2008-42871, 2020-88680, and 2020-202465 (Patent Documents 1 to 3), and to reduce spurious emissions by providing an air gap on the side of the resonance region as disclosed in, for example, Ting Wu et al., "Application of Free Side Edges to Thickness Shear Bulk Acoustic Resonator On Lithium Niobate for Suppression of Transverse Resonance", Materials of the Second Research Meeting of Acoustic Wave Element Technology Consortium, Mar. 8, 2021 (Non-patent document 1). It is also known that spurious emissions are reduced by providing irregularities on a pair of surfaces reflecting the acoustic wave of a multilayered film including the lower electrode, the piezoelectric film, and the upper electrode as disclosed in, for example, Japanese Patent Application Laid-Open No. 2020-202465 (Patent Document 4). Further, it is known to use a lithium niobate film or a lithium tantalate film as the piezoelectric film (for example, Patent Documents 1 to 3 and Non-Patent Document 1).

RELATED ART DOCUMENTS

Patent Documents

Japanese Patent Application Laid-Open No. 2008-42871
Japanese Patent Application Laid-Open No. 2020-88680
Japanese Patent Application Laid-Open No. 2020-205533
Japanese Patent Application Laid-Open No. 2020-202465

Non-Patent Documents

Ting Wu et al., "Application of Free Side Edges to Thickness Shear Bulk Acoustic Resonator On Lithium Niobate for Suppression of Transverse Resonances", Materials of the Second Research Meeting of Acoustic Wave Element Technology Consortium, Mar. 8, 2021

SUMMARY

As described in Patent Documents 1 to 3, spurious emissions can be reduced by forming an additional film in the edge region within the resonance region. However, there is still room for improvement in terms of reducing spurious emissions while reducing the size of the acoustic wave device.

It is an object of the present disclosure to reduce the size of an acoustic wave device and reduce spurious emissions.

The present disclosure provides, in one aspect, an acoustic wave device including: a substrate; a lower electrode and an upper electrode provided over the substrate; a piezoelectric film that is provided over the substrate, at least a part of the piezoelectric film being interposed between the lower electrode and the upper electrode thereby defining a resonance region in a plan view where the lower electrode and the upper electrode overlap with each other across said at least a part of the piezoelectric film, the piezoelectric film having a pair of through holes, the pair of through holes sandwiching the resonance region therebetween in a first direction in the plan view, being provided along the resonance region, and being connected to an air gap, the air gap being formed between the substrate and the lower electrode and overlapping with the resonance region in the plan view; and additional films that are not provided in a central region of the resonance region in the plan view and are provided in respective edge regions, which are located on respective sides of the central region in a second direction substantially orthogonal to the first direction in the plan view, of the resonance region.

In the above acoustic wave device, the lower electrode and the upper electrode may excite thickness-shear vibration in the piezoelectric film, and the second direction may be substantially parallel to a vibration direction of the thickness-shear vibration.

In the above acoustic wave device, a substantially entire circumference of the resonance region may be surrounded by the additional films and the pair of through holes in the plan view.

In the above acoustic wave device, in the plan view, the pair of through holes may be in contact with the resonance region at respective sides of the resonance region in the first direction.

In the above acoustic wave device, the resonance region may have a substantially rectangular shape in the plan view, and sides opposite to each other in the first direction of the resonance region may be defined by the pair of through holes.

In the above acoustic wave device, the additional films may be longer than the resonance region in the first direction, and at least a part of each of the pair of through holes may be sandwiched between the additional films in the second direction in the plan view.

In the above acoustic wave device, the additional films may be provided in a ring shape on at least one of the following surfaces: a first surface of the piezoelectric film on which the lower electrode is provided and a second surface of the piezoelectric film on which the upper electrode is provided, and the pair of through holes may be provided inside the ring-shaped additional films.

The present disclosure provides, in another aspect, a filter including the above acoustic wave device.

The present disclosure provides, in another aspect, a multiplexer including the above filter.

The present disclosure provides, in another aspect, a manufacturing method of an acoustic wave device, the manufacturing method including: forming a lower electrode on a first surface of a piezoelectric film, the piezoelectric film further having a second surface opposite to the first surface; forming a first additional film on at least a tip portion of the lower electrode, the first additional film having a substantially rectangular shape in a plan view; forming a sacrificial layer covering the lower electrode and the first additional film over the first surface of the piezoelectric film; thereafter, bonding a resulting multilayer structure to a substrate such that the first surface of the piezoelectric film faces the substrate through the sacrificial layer and the first additional film; forming an upper electrode on the second surface of the piezoelectric film; forming a second additional film on at least a tip portion of the upper electrode, the second additional film having a substantially rectangular shape in a plan view; forming, in the piezoelectric film, a pair of through holes that sandwich a resonance region therebetween in a first direction and that are provided along the resonance region in a plan view, the resonance region being defined as a region where the lower electrode and the upper electrode overlap with each other across the piezoelectric film in the plan view, the first direction being a width direction of the lower electrode and the upper electrode; and removing the sacrificial layer by introducing an etching medium into the pair of through holes.

In the above manufacturing method, the forming of the pair of through holes may include forming the pair of through holes so that a length of at least one of the pair of through holes in a second direction substantially orthogonal to the first direction is longer than a length of the resonance region in the second direction.

In the above manufacturing method, the forming of the first additional film may include forming the first additional film that is provided from a tip portion of the lower electrode to a front side of the lower electrode, and has a side surface inclined with respect to a normal line of the first surface of the piezoelectric film in a cross-sectional view.

DETAILED DESCRIPTION

Hereinafter, embodiments of the present invention will be described with reference to the accompanying drawings. In the embodiments, a piezoelectric thin film resonator will be described as an example of the acoustic wave device.

First Embodiment

Figure 1:
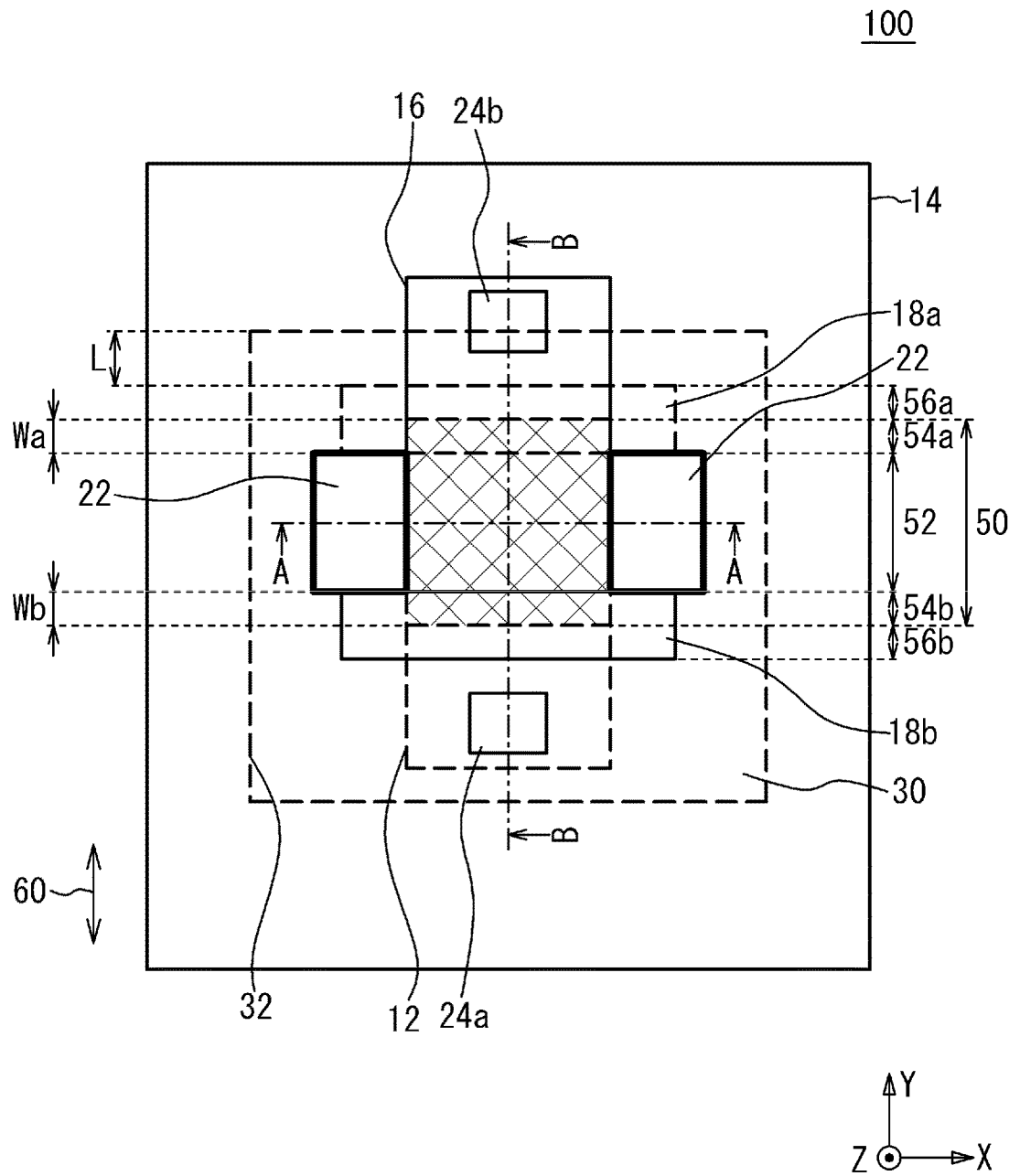
FIG. 1 is a plan view of a piezoelectric thin film resonator in accordance with a first embodiment.
Figure 2A:
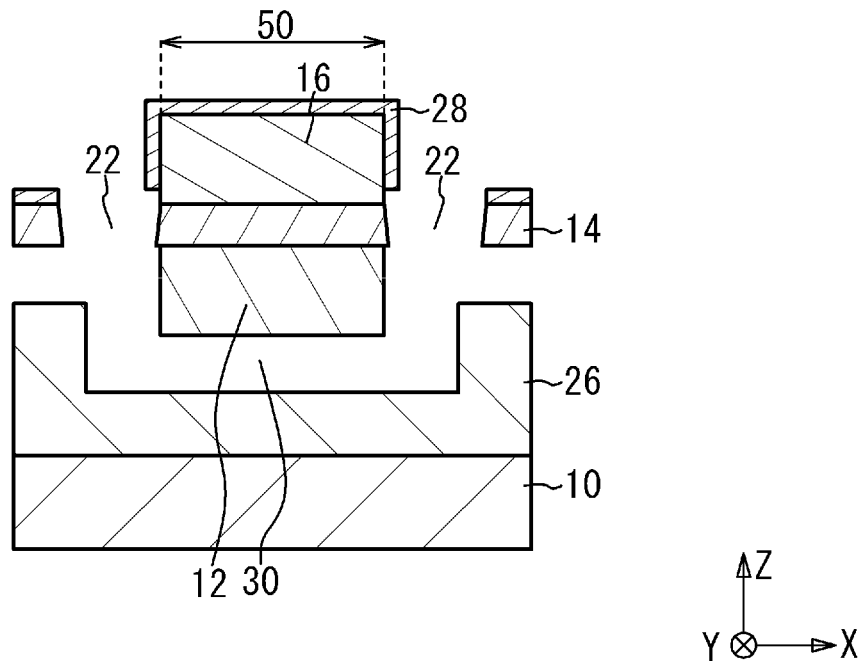
FIG. 2A is a cross-sectional view taken along line A-A in FIG. 1.

FIG. 1 is a plan view of a piezoelectric thin film resonator 100 in accordance with a first embodiment. FIG. 2A is a cross-sectional view taken along line A-A in FIG. 1, and FIG. 2B is a cross-sectional view taken along line B-B in FIG. 1.

In FIG. 1, for clarity of the drawing, a passivation film 28 is not illustrated, a resonance region 50 is hatched, and through holes 22 are illustrated by lines thicker than the others (the same applies to similar drawings hereinafter). The normal direction of a piezoelectric film 14 is defined as a Z direction, a vibration direction 60 of the thickness-shear vibration is defined as a Y direction, and the direction that is the plane direction of the piezoelectric film 14 and is perpendicular to the Y direction is defined as an X direction. The X direction, the Y direction, and the Z direction do not necessarily correspond to the X axis, the Y axis, and the Z axis of the crystal orientation of the piezoelectric film 14. When the crystal orientations are referred to, they are described as the X-axis orientation, the Y-axis orientation, and the Z-axis orientation, and are distinguished from the X direction, the Y direction, and the Z direction.

Figure 2B:
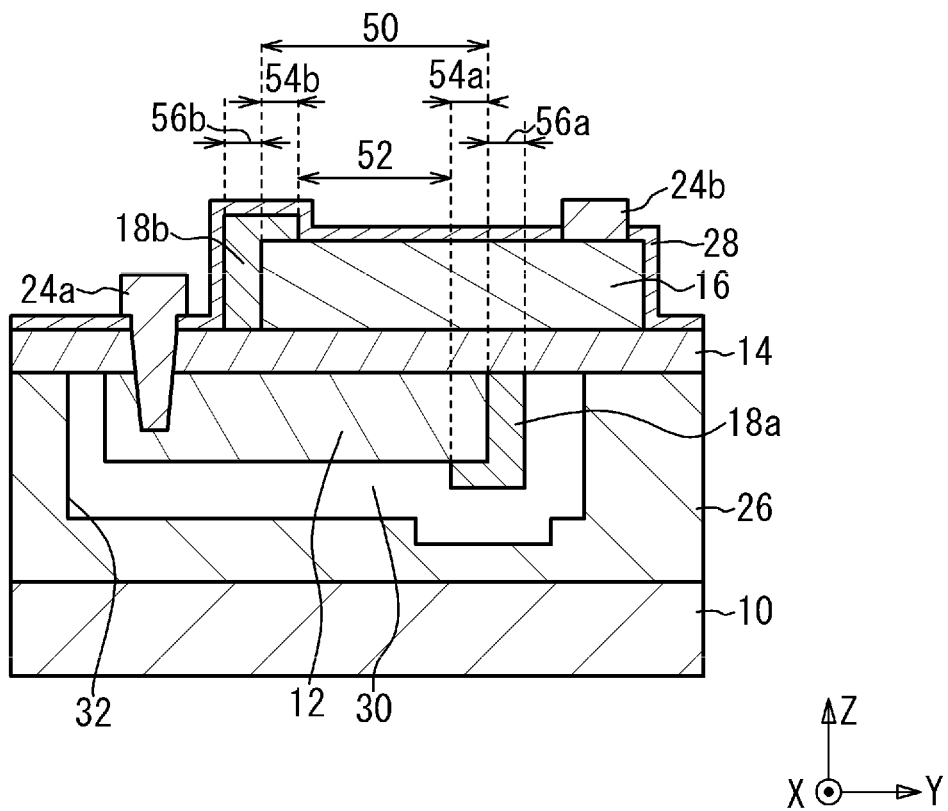
FIG. 2B is a cross-sectional view taken along line B-B in FIG. 1.

As illustrated in FIG. 1, FIG. 2A, and FIG. 2B, the piezoelectric thin film resonator 100 includes a substrate 10, a lower electrode 12, the piezoelectric film 14, an upper electrode 16, additional films 18a and 18b, terminal electrodes 24a and 24b, an insulating film 26, and the passivation film 28.

The insulating film 26 is provided on the substrate 10 and has a recess 32. The piezoelectric film 14 is provided on the insulating film 26 so as to cover the recess 32. The upper and lower surfaces of the piezoelectric film 14 are substantially flat surfaces. The lower electrode 12 is provided on the lower surface of the piezoelectric film 14 so as to be positioned in the recess 32. An air gap 30 is formed between the lower electrode 12 and the insulating film 26. The upper electrode 16 is provided on the upper surface of the piezoelectric film 14. A region where the lower electrode 12 and the upper electrode 16 overlap each other in a plan view with at least a part of the piezoelectric film 14 interposed therebetween is a resonance region 50. The resonance region 50 is located so as to overlap the air gap 30 in a plan view. The air gap 30 is larger than the resonance region 50 in a plan view. In a plan view, the side surface of the lower electrode 12 and the side surface of the upper electrode 16 substantially coincide with each other, for example. The term "substantially coincide with" means that a difference is acceptable to the extent of manufacturing errors. The thickness of the lower electrode 12 and the thickness of the upper electrode 16 are, for example, about 20 nm to 150 nm. The thickness of the piezoelectric film 14 is, for example, about 200 nm to 1000 nm.

The terminal electrode 24a is electrically connected to the lower electrode 12, and the terminal electrode 24b is electrically connected to the upper electrode 16. When high-frequency power is applied between the terminal electrode 24a and the terminal electrode 24b (i.e., between the lower electrode 12 and the upper electrode 16), an acoustic wave having a displacement in a direction substantially orthogonal to the Z direction (i.e., the strain direction with respect to the thickness) is excited in the piezoelectric film 14 within the resonance region 50. This vibration is referred to as thickness-shear vibration. The direction in which the displacement of the thickness-shear vibration is largest (the displacement direction of the thickness-shear vibration) is defined as the vibration direction 60 of the thickness-shear vibration. Here, the vibration direction 60 of the thickness-shear vibration is the Y direction. The wavelength of the acoustic wave is approximately twice the thickness of the piezoelectric film 14. The planar shape of the resonance region 50 is substantially rectangular. The substantially rectangular shape has four substantially straight sides. As is clear from the above, the term "substantially rectangular" is not limited to a case in which the four sides are completely straight lines, and a case in which the shape is deformed from a rectangle to the extent that does not affect the device characteristics is also acceptable. Among the four sides, a pair of sides extend substantially in the Y direction (i.e., the vibration direction 60 of the thickness-shear vibration), and another pair of sides extend substantially in the X direction (i.e., the direction orthogonal to the vibration direction 60 of the thickness-shear vibration).

The resonance region 50 has a central region 52 and edge regions 54a and 54b located on respective sides of the central region 52 in the Y direction. The edge regions 54a and 54b extend substantially in the X direction. The widths Wa and Wb of the edge regions 54a and 54b in the Y direction are substantially constant in the X direction.

The additional film 18a is provided at least under the tip portion, which is located in the edge region 54a, of the lower electrode 12, and is located in the recess 32 formed in the insulating film 26. The additional film 18a has a substantially rectangular shape in a plan view. The substantially rectangular shape is not limited to a case in which each side is completely straight, and a case in which the shape is deformed from a rectangle to the extent that does not affect the device characteristics is also acceptable. The additional film 18a is provided, for example, from the edge region 54a to a region 56a outside the resonance region 50, and covers the edge surface of the lower electrode 12. The thickness of the additional film 18a on the tip portion of the lower electrode 12 is, for example, about 10 nm to 70 nm. The additional film 18b is provided at least on the tip portion, which is located in the edge region 54b, of the upper electrode 16. The additional film 18b has a substantially rectangular shape in a plan view. The substantially rectangular shape is not limited to a case in which each side is completely straight, and a case in which the shape is deformed from a rectangle to the extent that does not affect the device characteristics is also acceptable. The additional film 18b is provided, for example, from the edge region 54b to a region 56b outside the resonance region 50, and covers the edge surface of the upper electrode 16. The thickness of the additional film 18b on the tip portion of the upper electrode 16 is, for example, about 10 nm to 70 nm. As described above, the additional film 18a and the additional film 18b are provided apart from each other in the Y direction. The additional films 18a and 18b extend further outward than the resonance region 50, for example, in the X direction.

In the piezoelectric film 14, a pair of the through holes 22 that sandwich the resonance region 50 therebetween in the X direction are formed, and are located along the resonance region 50 in the Y direction. In a plan view, the through holes 22 are in contact with the resonance region 50 on respective sides of the resonance region 50 in the X direction. That is, in a plan view, a pair of the through holes 22 define the sides opposite to each other in the X direction of the substantially rectangular resonance region 50. Each through hole 22 has a substantially rectangular shape in a plan view, for example. The substantially rectangular shape is not limited to a case in which each side is completely straight, and a case in which the shape is deformed from a rectangle to the extent that does not affect the device characteristics is also acceptable Each through hole 22 is connected to the air gap 30, and is communicated with the air gap 30. Since the additional films 18a and 18b extend further outward than the resonance region 50 in the X direction, at least a part of each of the through holes 22 is sandwiched between the additional films 18a and 18b in the Y direction in a plan view. The additional films 18a and 18b and a pair of the through holes 22 are provided so as to surround the resonance region 50 in a plan view. The widths of the additional films 18a and 18b in the Y direction are, for example, about 1000 μm to 1500 μm and the widths of the through holes 22 in the X direction are, for example, about 1000 μm to 1500 μm. The length L of the air gap 30 between the side surface of the recess 32 of the insulating film 26 and the additional film 18a is preferably equal to or greater than 2λ (λ is the wavelength of the acoustic wave) to reduce the characteristic degradation.

The passivation film 28 is provided so as to cover the upper surface of the piezoelectric film 14, the surface of the upper electrode 16, and the surface of the additional film 18b. The terminal electrode 24a penetrates through the passivation film 28 and the piezoelectric film 14 and is coupled to the lower electrode 12. The terminal electrode 24b penetrates through the passivation film 28 and is coupled to the upper electrode 16.

The substrate 10 is, for example, a silicon substrate, a sapphire substrate, an alumina substrate, a spinel substrate, a quartz substrate, a crystal substrate, a glass substrate, a ceramic substrate, or a GaAs substrate. The insulating film 26 is, for example, a silicon oxide film, a silicon nitride film, or an aluminum oxide film. The piezoelectric film 14 is, for example, a monocrystalline lithium niobate film, a monocrystalline lithium tantalate film, or a crystal, and is, for example, a rotated Y-cut lithium niobate film or a rotated Y-cut lithium tantalate film. The lower electrode 12 and the upper electrode 16 are, for example, single-layer films of ruthenium (Ru), chromium (Cr), aluminum (Al), titanium (Ti), copper (Cu), molybdenum (Mo), tungsten (W), tantalum (Ta), platinum (Pt), rhodium (Rh), or iridium (Ir), or multilayered films of any combination thereof.

The additional films 18a and 18b are, for example, metal films exemplified in the lower electrode 12 and the upper electrode 16 or insulating films such as silicon oxide films, silicon nitride films, or aluminum oxide films. The additional film 18*a* and the additional film 18*b* may be formed of the same material or different materials. The passivation film 28 is an insulating film such as a silicon oxide film, a silicon nitride film, or an aluminum oxide film. The terminal electrodes 24*a* and 24*b* are metal layers including a gold layer, a copper layer or the like.

Manufacturing Method

FIG. 3A to FIG. 6D are cross-sectional views illustrating a method of manufacturing the piezoelectric thin film resonator 100 in accordance with the first embodiment. FIG. 3A to FIG. 3C, FIG. 4A to FIG. 4C, FIG. 5A, FIG. 5B, FIG. 6A, and FIG. 6B are cross-sectional views of the portion along line A-A in FIG. 1. FIG. 3D to FIG. 3F, FIG. 4D to FIG. 4F, FIG. 5C, FIG. 5D, FIG. 6C, and FIG. 6D are cross-sectional views of the portion along line B-B in FIG. 1.

Figure 3A:
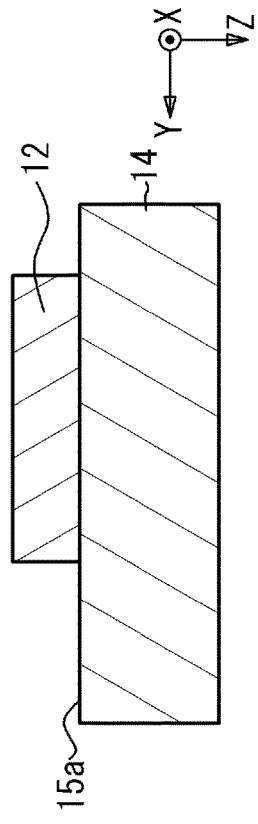
FIG. 3A to FIG. 3F are cross-sectional views (part 1) illustrating a method of manufacturing the piezoelectric thin film resonator in accordance with the first embodiment.
Figure 3B:
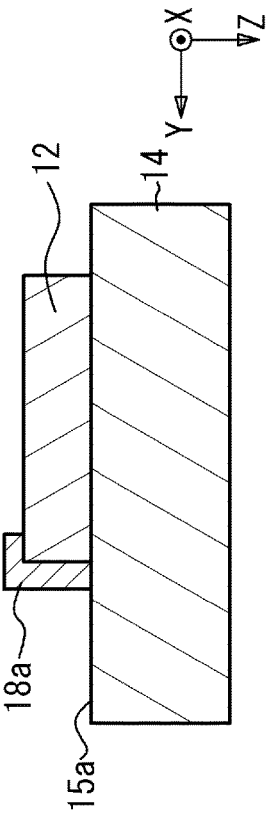
Figure 3C:
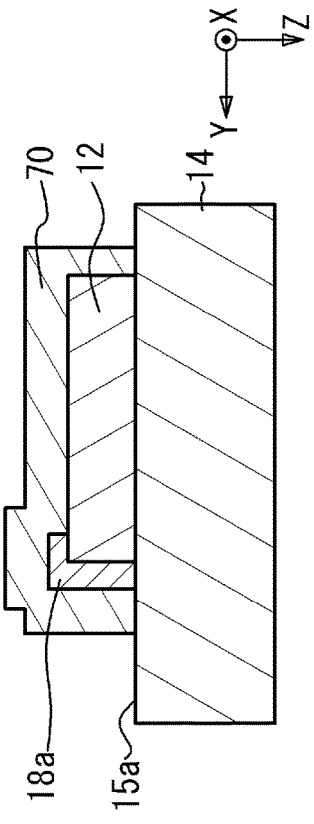
Figure 3D:
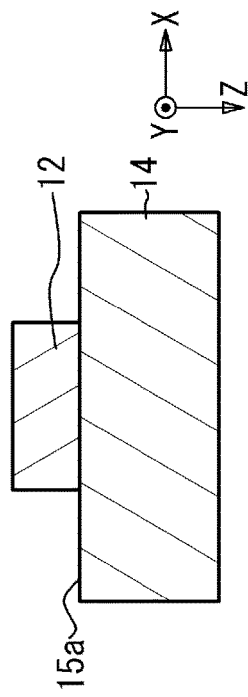

As illustrated in FIG. 3A and FIG. 3D, the lower electrode 12 is formed on a surface 15*a* (a first surface) of the piezoelectric film 14. The piezoelectric film 14 here is a film (substrate) thicker than the piezoelectric film 14 illustrated in FIG. 2A and FIG. 2B. The lower electrode 12 is formed by depositing a film by, for example, sputtering, vacuum evaporation, or chemical vapor deposition (CVD), and then patterning the film into a desired shape by photolithography and etching. The lower electrode 12 may be formed by lift-off.

Figure 3E:
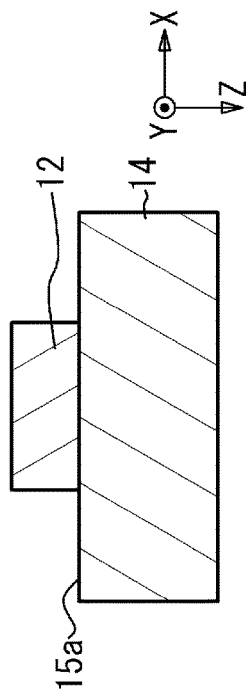

As illustrated in FIG. 3B and FIG. 3E, the additional film 18*a* is formed on the first surface 15*a* of the piezoelectric film 14 so as to cover the tip portion of the lower electrode 12. The additional film 18*a* is formed, for example, from the upper surface of the tip portion of the lower electrode 12 to the surface 15*a* in front of the lower electrode 12 of the piezoelectric film 14. The additional film 18*a* is formed across the entire width of the lower electrode 12 and is formed to be longer than, for example, the width of the lower electrode 12. The additional film 18*a* is formed by depositing a film by, for example, sputtering, vacuum evaporation, or CVD, and then patterning the film into a desired shape by photolithography and etching. The additional film 18*a* may be formed by lift-off.

Figure 3F:
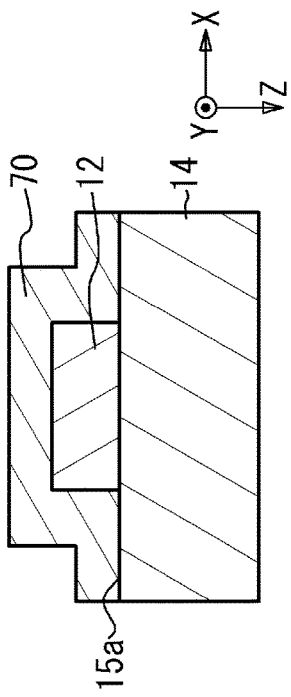

As illustrated in FIG. 3C and FIG. 3F, a sacrificial layer 70 covering the lower electrode 12 and the additional film 18*a* is formed on the surface 15*a* of the piezoelectric film 14. The thickness of the sacrificial layer 70 is, for example, about 50 nm to 300 nm. The sacrificial layer 70 is selected from materials easily soluble in an etching solution or etching gas, such as MgO, ZnO, Ge, or $SiO_2$. The sacrificial layer 70 is formed by depositing a film by, for example, sputtering, vacuum evaporation, or CVD, and then patterning the film into a desired shape by photolithography and etching. The sacrificial layer 70 may be formed by lift-off.

Figure 4A:
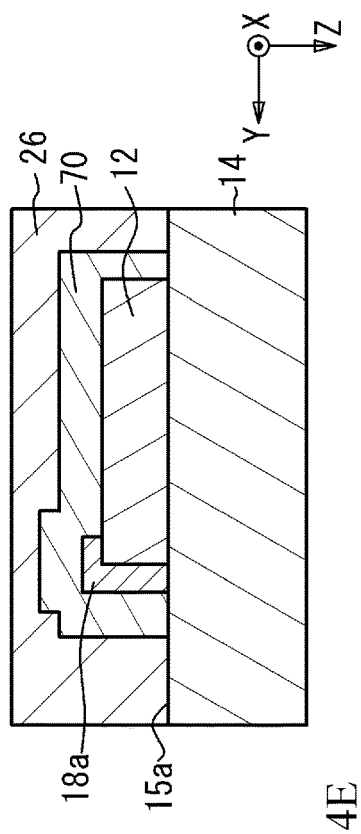
FIG. 4A to FIG. 4F are cross-sectional views (part 2) illustrating the method of manufacturing the piezoelectric thin film resonator in accordance with the first embodiment.
Figure 4B:
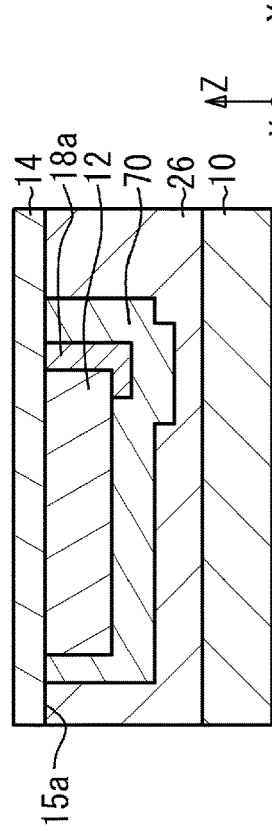
Figure 4C:
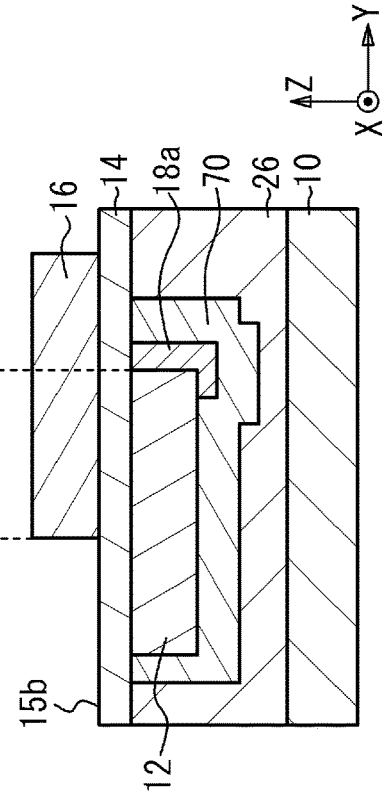
Figure 4D:
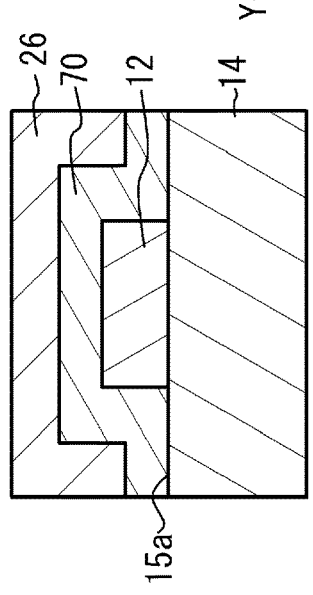

As illustrated in FIG. 4A and FIG. 4D, the insulating film 26 covering the sacrificial layer 70 is formed on the first surface 15*a* of the piezoelectric film 14, and the upper surface of the insulating film 26 is then polished by, for example, chemical mechanical polishing (CMP). As a result, the insulating film 26 has a desired thickness and the upper surface thereof is planarized.

Figure 4E:
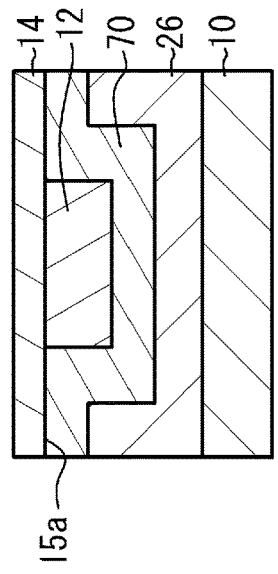

As illustrated in FIG. 4B and FIG. 4E, the insulating film 26 is bonded to the substrate 10. That is, the multilayer structure is bonded to the substrate while the surface 15*a* side of the piezoelectric film 14 is opposite to the substrate 10. Thereafter, the upper surface of the piezoelectric film 14 is polished by, for example, CMP to be thinned.

Figure 4F:
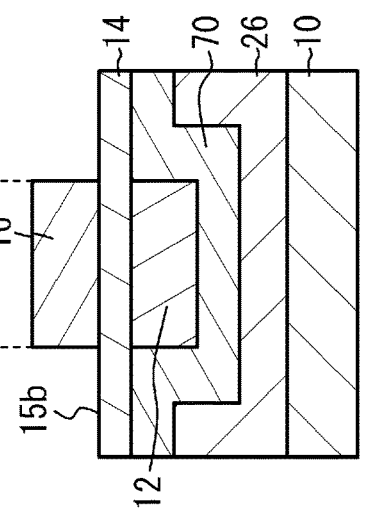

As illustrated in FIG. 4C and FIG. 4F, the upper electrode 16 is formed on the other surface 15*b* (a second surface) of the piezoelectric film 14. The upper electrode 16 is formed by depositing a film by, for example, sputtering, vacuum evaporation, or CVD, and then patterning the film into a desired shape by photolithography and etching. The upper electrode 16 may be formed by lift-off.

Figures 5A, 5B, 5C, 5D:
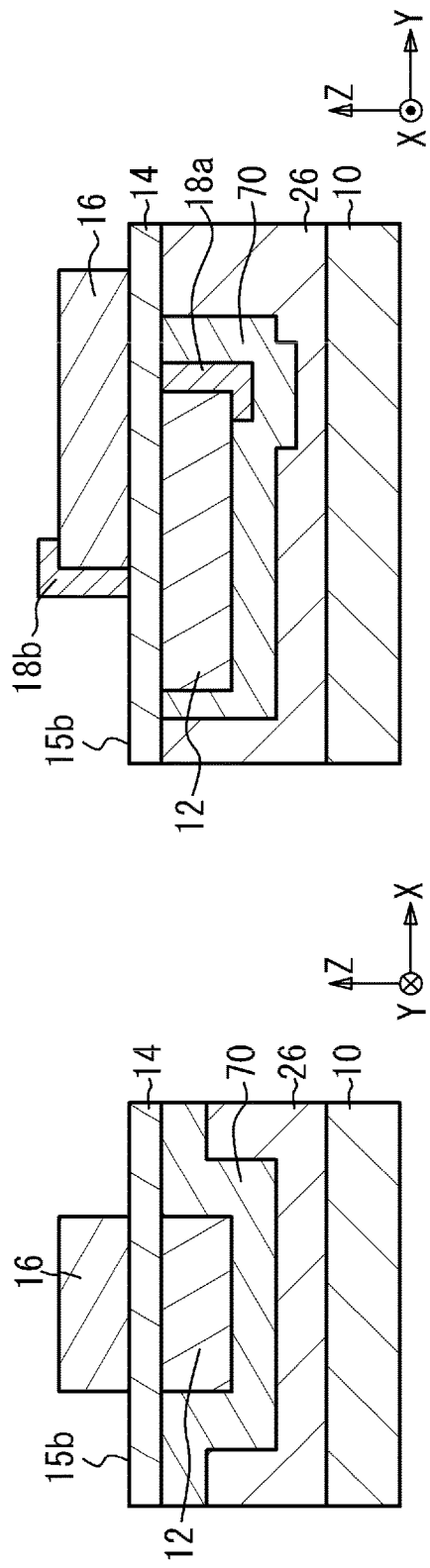
FIG. 5A to FIG. 5D are cross-sectional views (part 3) illustrating the method of manufacturing the piezoelectric thin film resonator in accordance with the first embodiment.

As illustrated in FIG. 5A and FIG. 5C, the additional film 18*b* is formed on the surface 15*b* of the piezoelectric film 14 so as to cover the tip portion of the upper electrode 16. The additional film 18*b* is formed so as to be away from the additional film 18*a* in the Y direction. The additional film 18*b* is formed, for example, from the upper surface of the tip portion of the upper electrode 16 to the surface 15*b* in front of the upper electrode 16 of the piezoelectric film 14. The additional film 18*b* is formed across the entire width of the upper electrode 16 and is formed so as to be longer than, for example, the width of the upper electrode 16. The additional film 18*b* is formed by depositing a film by, for example, sputtering, vacuum evaporation, or CVD, and then patterning the film into a desired shape by photolithography and etching. The additional film 18*b* may be formed by lift-off.

As illustrated in FIG. 5B and FIG. 5D, the passivation film 28 covering the upper electrode 16 and the additional film 18*b* is formed on the surface 15*b* of the piezoelectric film 14. The passivation film 28 is formed by, for example, sputtering, vacuum evaporation, or CVD. Then, an aperture 72 is formed in the passivation film 28 on the upper electrode 16 by, for example, photolithography and etching. Then, the protective film 28 and the piezoelectric film 14 are machined by, for example, milling to form a pair of the through holes 22, which sandwich the resonance region 50, where the lower electrode 12 and the upper electrode 16 overlap, therebetween in the X direction and are located along the resonance region 50 in the Y direction, in the piezoelectric film 14, and to form an aperture 74 dug up until reaching the lower electrode 12. The through holes 22 may reach a part of the sacrificial layer 70.

Figure 6A:
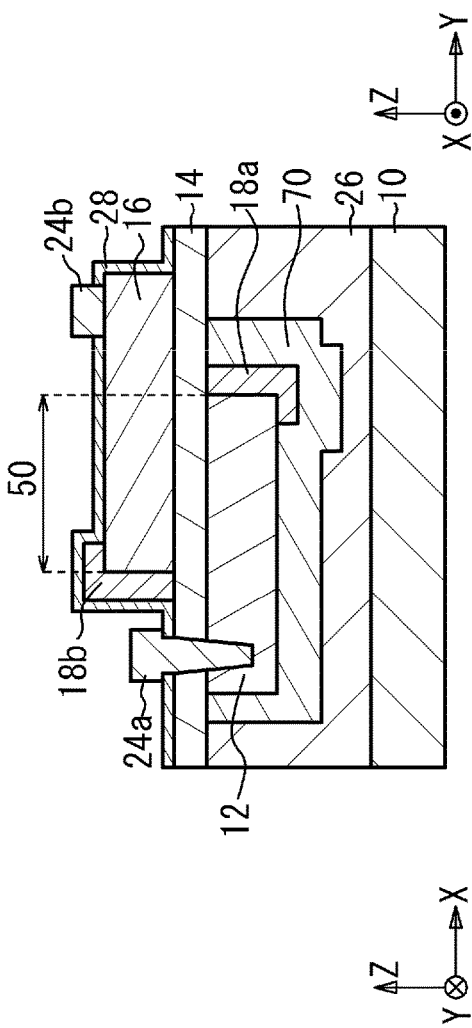
FIG. 6A to FIG. 6D are cross-sectional views (part 4) illustrating the method of manufacturing the piezoelectric thin film resonator in accordance with the first embodiment.
Figure 6C:
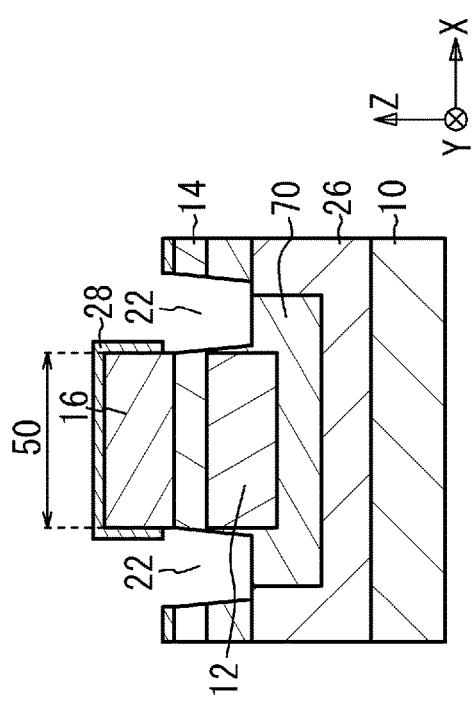

As illustrated in FIG. 6A and FIG. 6C, the terminal electrode 24*a* electrically connected to the lower electrode 12 is formed in the aperture 74, and the terminal electrode 24*b* electrically connected to the upper electrode 16 is formed in the aperture 72 by, for example, lift-off.

Figure 6B:
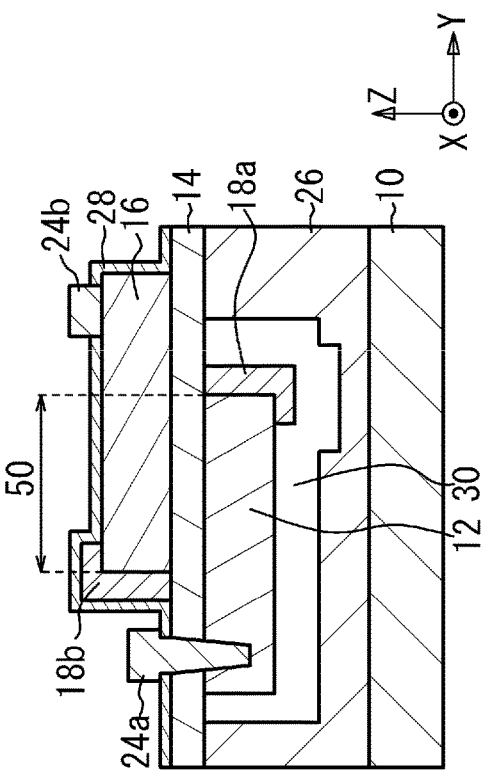
Figure 6D:
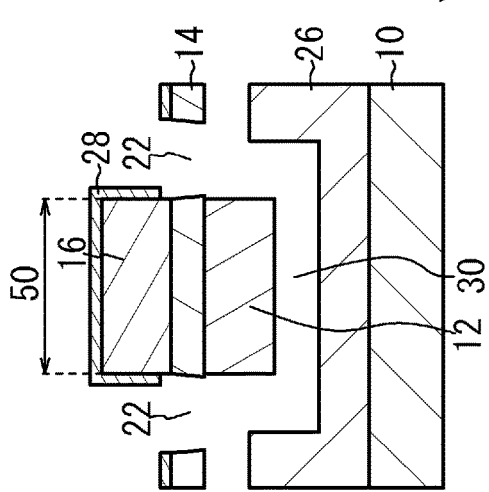

As illustrated in FIG. 6B and FIG. 6D, an etching medium such as an etching solution or etching gas for the sacrificial layer 70 is introduced into the sacrificial layer 70 below the lower electrode 12 through the through holes 22. This process removes the sacrificial layer 70. As the etching medium for etching the sacrificial layer 70, the medium that hardly etches materials constituting the resonator other than the sacrificial layer 70 is preferable. Particularly, the etching medium is preferably a medium that hardly etches the lower electrode 12 and the additional film 18*a*, which come in contact with the etching medium. By removing the sacrificial layer 70, the air gap 30 is formed between the lower electrode 12 and the insulating film 26 and between the additional film 18*a* and the insulating film 26. As described above, the piezoelectric thin film resonator 100 according to the first embodiment is formed.

Here, the crystal orientations of the piezoelectric film 14 will be described. First, the definition of Euler angles ($\varphi$, $\theta$, $\psi$) will be described. In a right-handed XYZ coordinate system, a normal direction of the upper surface of the piezoelectric layer 14 is defined as a Z direction, and directions orthogonal to the Z direction and orthogonal to each other in a plane direction of the upper surface of the piezoelectric layer 14 are defined as an X direction and a Y direction. First, the X direction, the Y direction, and the Z direction are configured to be correspond to the X-axis orientation, the Y-axis orientation, and the Z-axis orientation of the crystal orientations, respectively. Then, the +X direction is rotated by an angle φ about the Z direction from the +X direction to the +Y direction. The +Y direction is rotated by an angle θ about the X direction after the rotation of the angle φ from the +Y direction to the +Z direction. The +X direction is rotated by an angle ψ about the Z direction after the rotation of the angle θ from the +X direction to the +Y direction. The Euler angles obtained by rotating the directions in this manner are (φ, θ, ψ). The Euler angles expressed using (φ, θ, ψ) include equivalent Euler angles.

Figure 7A:
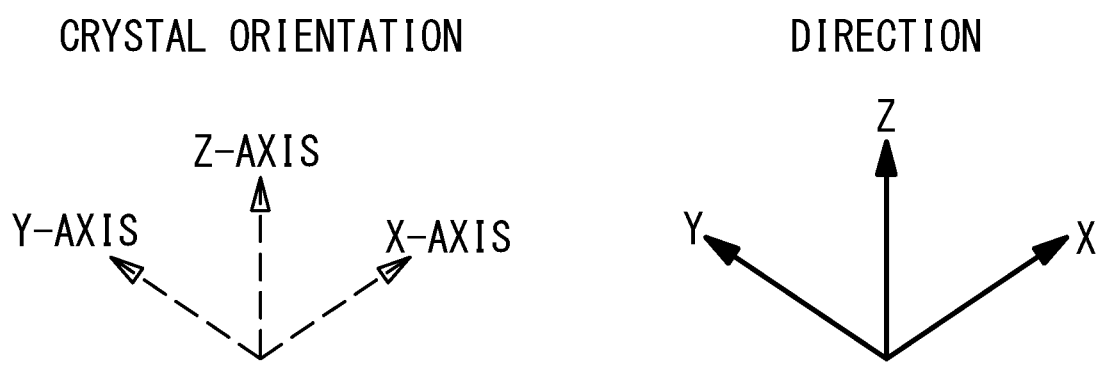
FIG. 7A and FIG. 7B illustrate crystal orientations in the case that the piezoelectric film is a lithium niobate film or a lithium tantalate film.
Figure 7B:
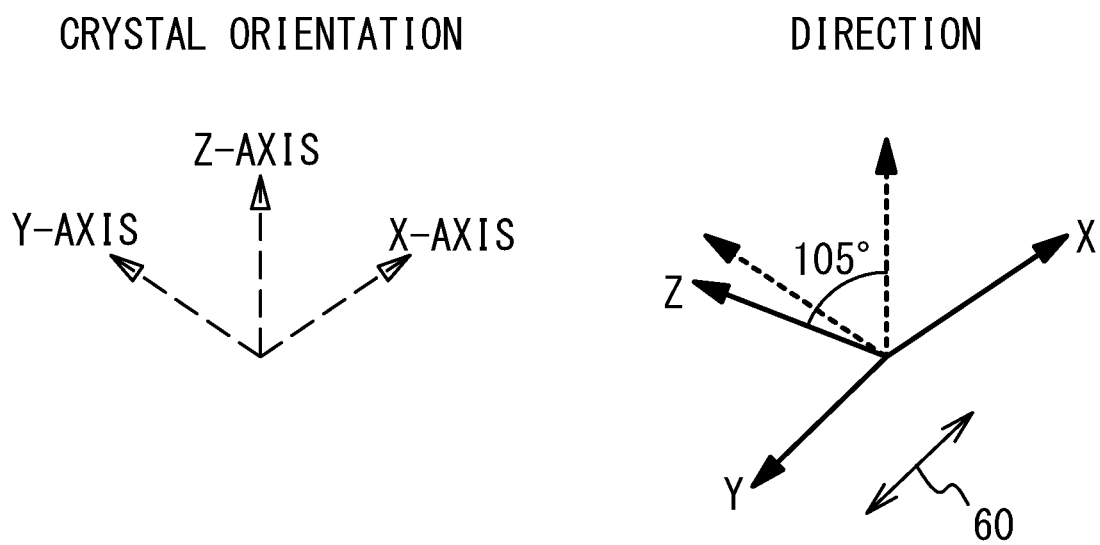

FIG. 7A and FIG. 7B illustrate the crystal orientations of the piezoelectric film 14. FIG. 7A and FIG. 7B illustrate a case in which the piezoelectric film 14 is a lithium niobate film or a lithium tantalate film. In FIG. 7A and FIG. 7B, broken line arrows on the left side indicate the orientations of the crystal axes of the piezoelectric film 14. Solid line arrows on the right side correspond to the X direction, Y direction, and Z direction in FIG. 1, FIG. 2A, and FIG. 2B. As illustrated in FIG. 7A, the +X direction, the +Y direction, and +Z direction are made to correspond to the +X-axis orientation, +Y-axis orientation, and +Z-axis orientation of the crystal orientations of the piezoelectric film 14, respectively. As illustrated in FIG. 7B, from the state illustrated in FIG. 7A, the Y direction and the Z direction are rotated 105° in the YZ plane about the X direction from the Y direction to the Z direction. In the case that the directions have been rotated as described above, a direction obtained by rotating the +Z-axis orientation of the crystal orientations 105° toward the +Y-axis orientation corresponds to the +Z direction. In this case, the Y direction corresponds to the vibration direction 60 of the thickness-shear vibration. The Euler angles are (0°, −105°, 0°).

The normal direction (the Z direction) of the upper surface of the piezoelectric film 14 is the direction in the Y-axis Z-axis plane. Therefore, thickness-shear vibration occurs in the planar direction of the piezoelectric film 14. The X-axis orientation is preferably a direction at an angle within a range of ±5° from the planar direction of the piezoelectric film 14, more preferably a direction at an angle within a range of ±1° from the planar direction of the piezoelectric film 14. The normal direction (the Z direction) of the upper surface of the piezoelectric film 14 is set to a direction obtained by rotating the +Z-axis orientation of the crystal orientations by 105° toward the +Y-axis orientation. As a result, the vibration direction 60 of the thickness-shear vibration and the direction orthogonal thereto are the planar direction of the piezoelectric film 14. The Z direction is preferably a direction at an angle within a range of ±5° from a direction obtained by rotating the +Z-axis orientation 105° from the +Z-axis orientation to the +Y-axis orientation, more preferably a direction at an angle within a range of ±1° from the direction obtained by rotating the Z-axis orientation 165° from the +Z-axis orientation to the +Y-axis orientation. The Euler angles are preferably (0°±5°, −105°±5°, 0°±5°).

Figure 8:
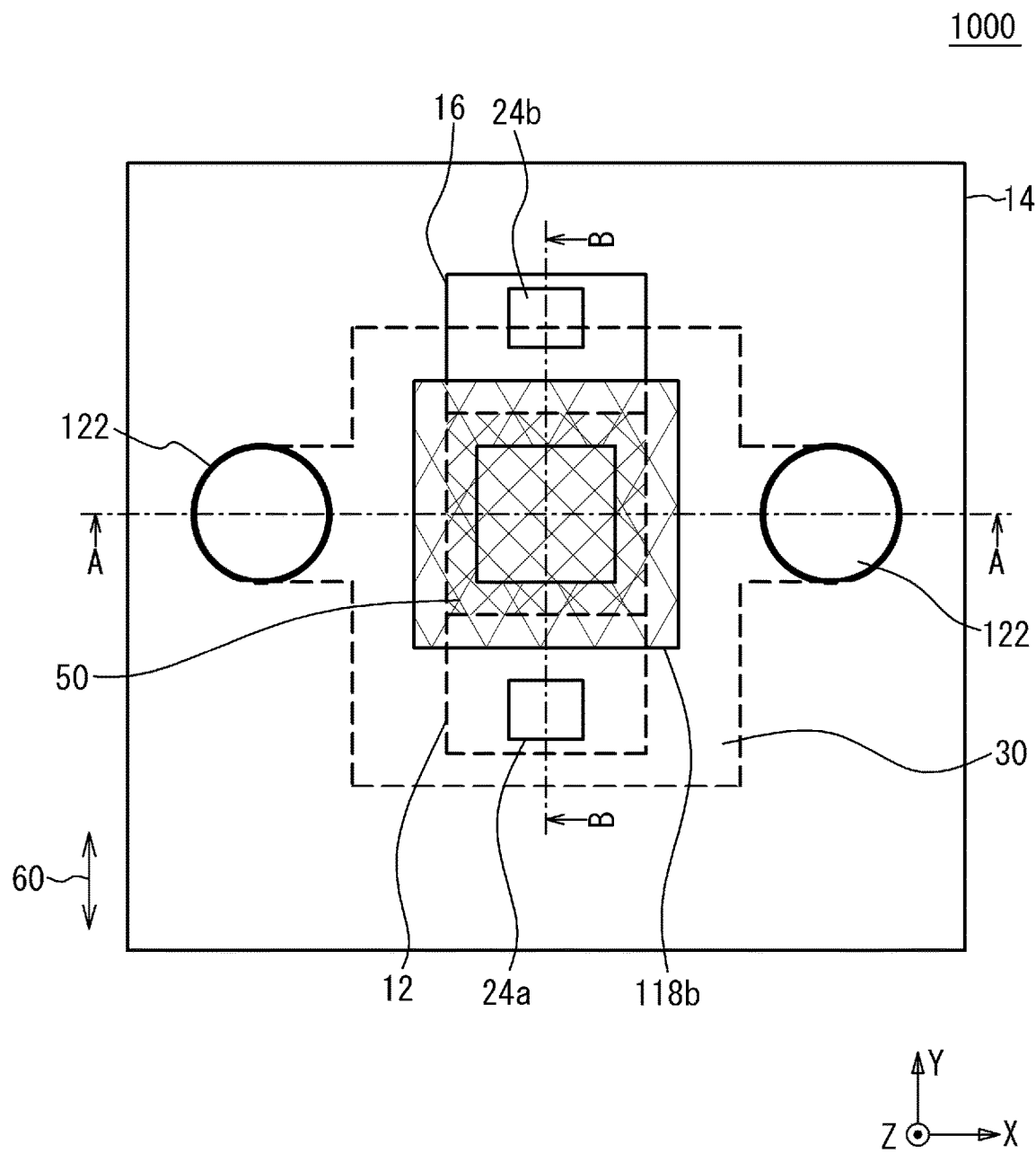
FIG. 8 is a plan view of a piezoelectric thin film resonator in accordance with a comparative example.
Figure 9A:
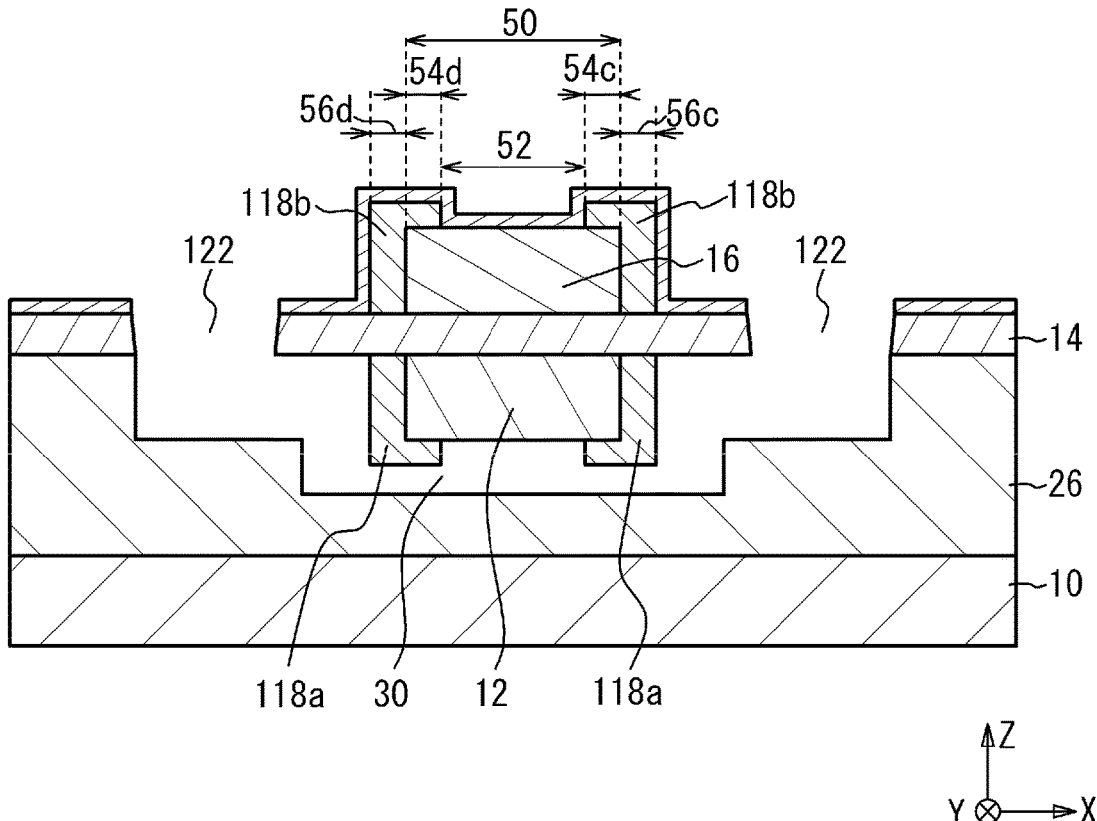
FIG. 9A is a cross-sectional view taken along line A-A in FIG. 8.
Figure 9B:
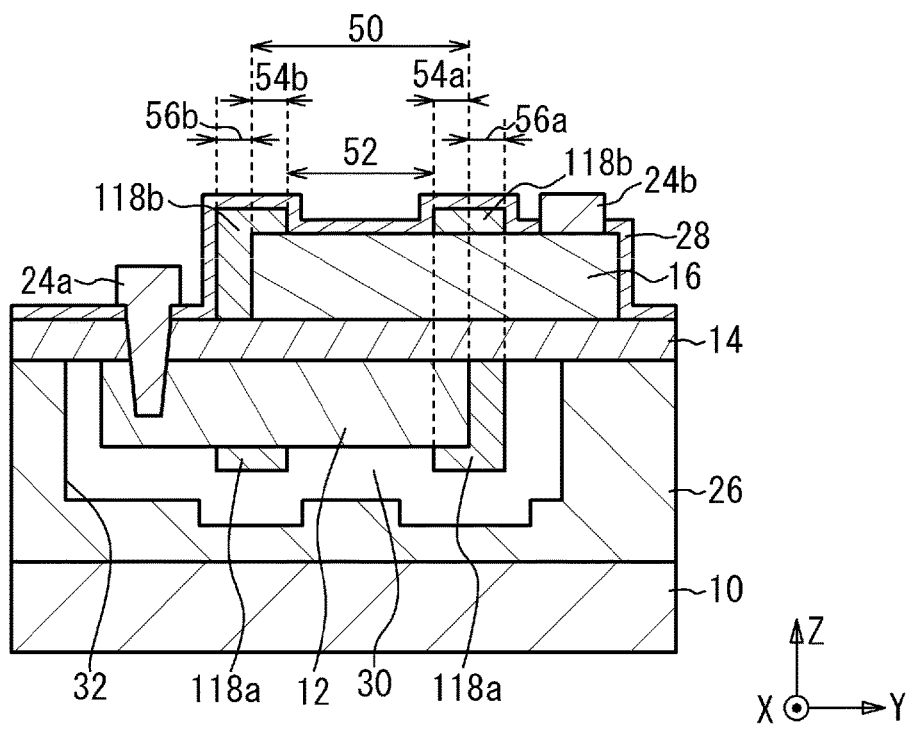
FIG. 9B is a cross-sectional view taken along line B-B in FIG. 8.

FIG. 8 is a plan view of a piezoelectric thin film resonator 1000 in accordance with a comparative example. FIG. 9A is a cross-sectional view taken along line A-A in FIG. 8, and FIG. 9B is a cross-sectional view taken along line B-B in FIG. 8. In FIG. 8, an additional film 118b is also hatched in addition to the resonance region 50 for clarity of the figure. As illustrated in FIG. 8, FIG. 9A, and FIG. 9B, in the piezoelectric thin film resonator 1000 in accordance with the comparative example, a ring-shaped additional film 118a along the four sides of the resonance region 50 is provided under the piezoelectric film 14 and the lower electrode 12, and a ring-shaped additional film 118b along the four sides of the resonance region 50 is provided on the piezoelectric film 14 and the upper electrode 16. That is, the additional films 118a and 118b are provided in all of the following regions: the edge regions 54a and 54b located on respective sides of the resonance region 50 in the Y direction and edge regions 54c and 54d located on respective sides of the resonance region 50 in the X direction. The additional films 118a and 118b are provided from the edge regions 54a to 54d of the resonance region 50 to regions 56a to 56d outside the resonance region 50. Through holes 122 for removing the sacrificial layer used to form the air gap 30 is provided outside the additional films 118a and 118b so as to be away from the resonance region 50. Other configurations are the same as those of the first embodiment, and the description thereof is thus omitted.

In the comparative example, the ring-shaped additional films 118a and 118b are provided in the edge regions 54a to 54d of the resonance region 50. Therefore, the acoustic velocity of the acoustic wave in the edge regions 54a to 54d becomes lower than the acoustic velocity of the acoustic wave in the central region 52, and the piston mode is achieved. Thus, lateral-mode spurious emissions due to the acoustic waves propagating in the X direction and the Y direction are reduced. However, since the through holes 122 for removing the sacrificial layer are provided further outward than the additional films 118a and 118b, the piezoelectric thin film resonator 1000 becomes large in size.

When an etching medium is introduced from one of a pair of the through holes 122 to the other to remove the sacrificial layer, as illustrated in FIG. 9A, the additional film 118a is present in the traveling direction of the etching medium. Therefore, it is difficult to remove the sacrificial layer formed in the inner region surrounded by the additional film 118a, and the sacrificial layer may remain. When the sacrificial layer remains and, for example, a hollow structure is not be obtained, the characteristics are deteriorated.

In contrast, in the first embodiment, as illustrated in FIG. 1, FIG. 2A, and FIG. 2B, the additional films 18a and 18b are provided in the edge regions 54a and 54b located on respective sides of the central region 52 of the resonance region 50 in the Y direction (a second direction). The through holes 22 are connected to the air gap 30, sandwich the resonance region 50 therebetween in the X direction (a first direction), and is provided along the resonance region 50. Therefore, the piezoelectric thin film resonator 100 can be miniaturized. Moreover, lateral-mode spurious emissions due to the acoustic wave propagating in the Y direction are reduced by the additional films 18a and 18b. Lateral-mode spurious emissions due to the acoustic wave propagating in the X direction are reduced by forming free ends by the through holes 22 provided along the resonance region 50. Therefore, in the first embodiment, it is possible to reduce the size of the piezoelectric thin film resonator 100 while reducing lateral-mode spurious emissions. As described above, the through holes 22 have two roles: removing the sacrificial layer used for forming the air gap 30 and reducing lateral-mode spurious emissions. The additional films 18a and 18b may be provided in edge regions located on both sides of the central region 52 of the resonance region 50 in a direction substantially orthogonal to the direction in which the through holes 22 sandwich the resonance region 50 therebetween. The term "substantially orthogonal" means that the inclination from the orthogonal direction to the extent of manufacturing errors is acceptable, and the inclination with respect to the orthogonal direction within a range of ±5° is acceptable.

In addition, in the first embodiment, as illustrated in FIG. 3B and FIG. 3E, the additional film 18a (a first additional film) having a substantially rectangular shape in a plan view is formed on at least the tip portion of the lower electrode 12. As illustrated in FIG. 3C and FIG. 3F, the sacrificial layer 70 covering the lower electrode 12 and the additional film 18a is formed on the surface 15a of the piezoelectric film 14. As illustrated in FIG. 4B and FIG. 4E, the multilayer structure is bonded to the substrate 10 while the surface 15a side of the piezoelectric film 14 is opposite to the substrate 10. As illustrated in FIG. 5A and FIG. 5C, the additional film 18b (a second additional film) having a substantially rectangular shape in a plan view is formed on at least the tip portion of the upper electrode 16. As illustrated in FIG. 5B and FIG. 5D, a pair of the through holes 22, which sandwich the resonance region 50 therebetween in the X direction (a first direction) and are provided along the resonance region 50, is formed in the piezoelectric film 14. As illustrated in FIG. 6B and FIG. 6D, the sacrificial layer 70 is removed by introducing an etching medium into the pair of the through holes 22. As illustrated in FIG. 6B, since the additional film 18a does not exist in the traveling direction of the etching medium introduced into the pair of the through holes 22, the sacrificial layer 70 can be prevented from remaining without being removed. The substantially rectangular shape of the additional films 18a and 18b in a plan view is not limited to a case in which each side is completely straight, and a case in which the shape is deformed from a rectangle to the extent that does not affect the device characteristics is also acceptable.

Figure 10A:
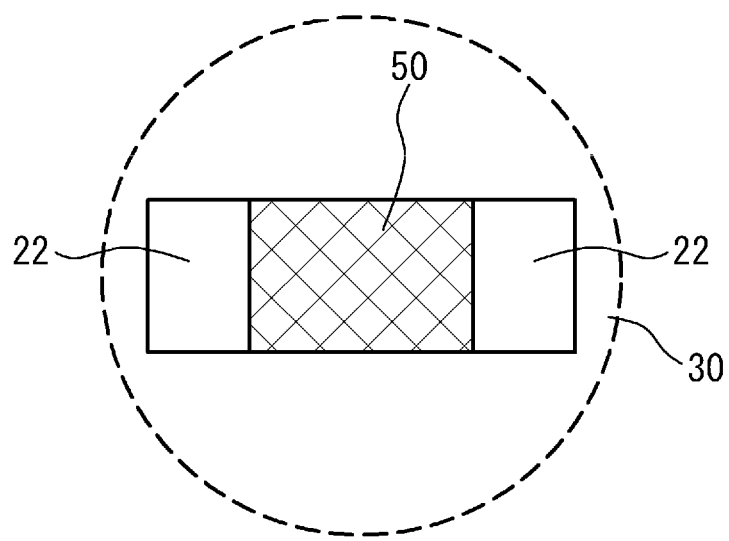
FIG. 10A to FIG. 10C are plan views illustrating other examples of an air gap.
Figure 10B:
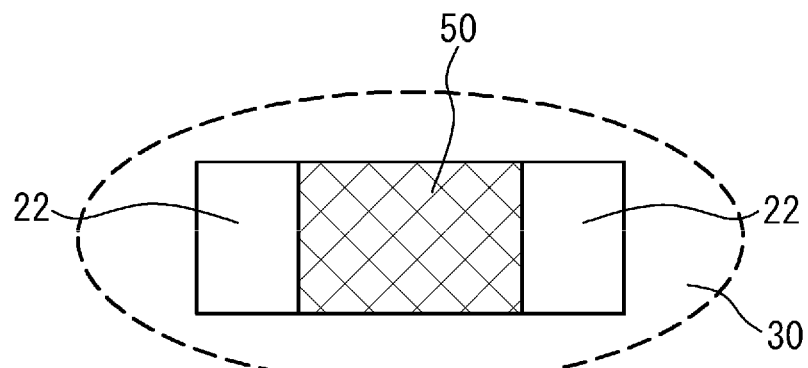
Figure 10C:
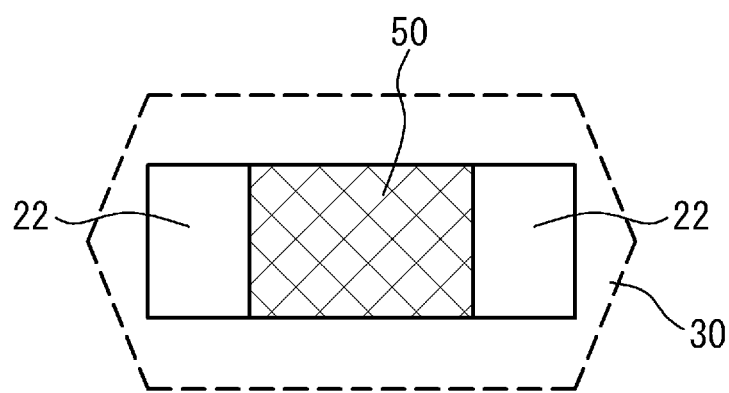

FIG. 10A to FIG. 10C are plan views illustrating other examples of the air gap 30. FIG. 1 illustrates a case in which the air gap 30 is substantially rectangular in a plan view as an example, but this does not intend to suggest any limitation. The air gap 30 may have a circular shape as illustrated in FIG. 10A, an elliptical shape as illustrated in FIG. 10B, or a polygonal shape having five or greater apexes such as a hexagonal shape as illustrated in FIG. 10C. The substantially rectangular shape of the gap 30 in a plan view is not limited to a case in which each side is completely straight, and a case in which the shape is deformed from a rectangle to the extent that does not affect the device characteristics is also acceptable.

By forming the lower electrode 12 on the surface 15a of the piezoelectric film 14 by sputtering or the like and forming the upper electrode 16 on the surface 15b of the piezoelectric film 14 by sputtering or the like, stresses that the piezoelectric film 14 receives from the lower electrode 12 and the upper electrode 16 are cancelled. Therefore, when the sacrificial layer 70 is removed, the lower electrode 12 and/or the additional film 18a may stick to the sacrificial layer 70. This sticking tends to occur at the corners of the air gap 30. Therefore, by forming the air gap 30 in a circular shape or an elliptical shape, or by forming the air gap 30 in a polygonal shape having large apex angles, it is possible to inhibit the sticking between the lower electrode 12 and/or the additional film 18a and the sacrificial layer 70 at the corner portion of the air gap 30.

In the first embodiment, the X direction in which a pair of the through holes 22 sandwich the resonance region 50 therebetween is a direction substantially orthogonal to the vibration direction 60 of the thickness-shear vibration. The additional films 18a and 18b are provided in the edge regions 54a and 54b of the resonance region 50 in the Y direction that is substantially parallel to the vibration direction 60 of the thickness-shear vibration, respectively. As described above, the through holes 22 are provided so as to sandwich the resonance region 50 therebetween in the direction substantially orthogonal to the vibration direction 60 of the thickness-shear vibration, and thus it is possible to effectively reduce lateral-mode spurious emissions due to the acoustic wave propagating in the direction substantially orthogonal to the vibration direction 60 of the thickness-shear vibration. The direction substantially orthogonal to the vibration direction 60 of the thickness-shear vibration means that a case in which the inclination from the direction substantially orthogonal to the vibration direction 60 of the thickness-shear vibration to the extent of manufacturing errors is acceptable, and a case in which the inclination from the direction substantially orthogonal to the vibration direction 60 of the thickness-shear vibration within a range of ±5° is acceptable. Further, by providing the additional films 18a and 18b in the edge regions 54a and 54b in the direction that is substantially parallel to the vibration direction 60 of the thickness-shear vibration, it is possible to reduce lateral-mode spurious emissions due to the acoustic wave propagating in the direction substantially parallel to the vibration direction 60 of the thickness-shear vibration. The direction substantially parallel to the vibration direction 60 of the thickness-shear vibration means that a case in which the inclination from the vibration direction 60 of the thickness-shear vibration to the extent of manufacturing errors is acceptable, and a case in which the inclination from the vibration direction 60 of the thickness-shear vibration within a range of ±5° is acceptable.

In the first embodiment, as illustrated in FIG. 1, the substantially entire circumference of the resonance region 50 is surrounded by the additional films 18a and 18b and a pair of the through holes 22 in a plan view. This structure effectively reduces lateral-mode spurious emissions. The substantially entire circumference is 90% or greater of the circumference of the resonance region 50, and may be 95% or greater of the circumference of the resonance region 50. In a plan view, ½ or greater of, or ¾ or greater of the circumference of the resonance region 50 may be surrounded by the additional films 18a and 18b and a pair of the through holes 22. The entire circumference of the resonance region 50 is preferably completely surrounded by the additional films 18a and 18b and a pair of the through holes 22 in a plan view.

In the first embodiment, as illustrated in FIG. 1, in a plan view, a pair of the through holes 22 are in contact with the resonance region 50 on respective sides of the resonance region 50 in the X direction (a first direction). Thus, lateral-mode spurious emissions are effectively reduced because of the formation of the free ends by the through holes 22.

In the first embodiment, as illustrated in FIG. 1, the resonance region 50 has a substantially rectangular shape in a plan view, and the sides of the resonance region 50 opposite to each other in the X direction (a first direction) are defined by a pair of the through holes 22. Thereby, it is possible to effectively reduce lateral-mode spurious emissions due to the acoustic wave propagating in the X direction. The term "substantially rectangular" is not limited to a case in which each side is completely straight, and a case in which the shape is deformed from a rectangle to the extent that does not affect the device characteristics is also acceptable.

Furthermore, in the first embodiment, as illustrated in FIG. 1, the additional films 18a and 18b are longer than the resonance region 50 in the X direction (a first direction), and at least a part of each of the through holes 22 is sandwiched between the additional films 18a and 18b in the Y direction (a second direction) in a plan view. Thus, even when the positions of the additional films 18a and 18b are shifted because of manufacturing errors, it is possible to obtain a structure in which the substantially entire circumference of the resonance region 50 is surrounded by the additional films 18a and 18b and a pair of the through holes 22 in a plan view. Therefore, lateral-mode spurious emissions can be effectively reduced. The additional films 18a and 18b may be provided to have substantially the same length as the resonance region 50 in the X direction. The term "substantially the same length" means that a difference is acceptable to the extent of manufacturing errors, and the ratio of one length to the other length may be 95% or more and 105% or less.

Second Embodiment

Figure 11:
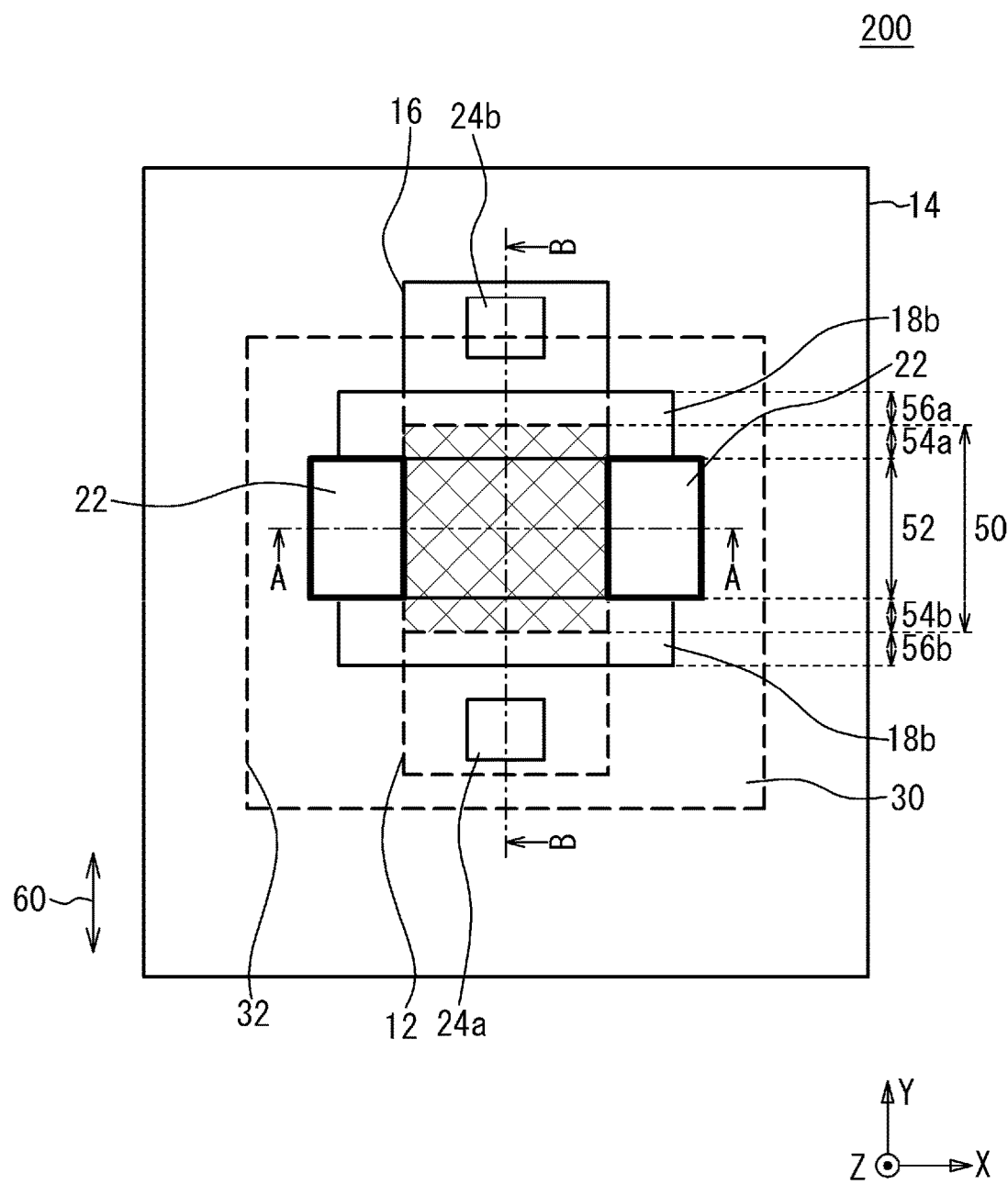
FIG. 11 is a plan view of a piezoelectric thin film resonator in accordance with a second embodiment.
Figure 12A:
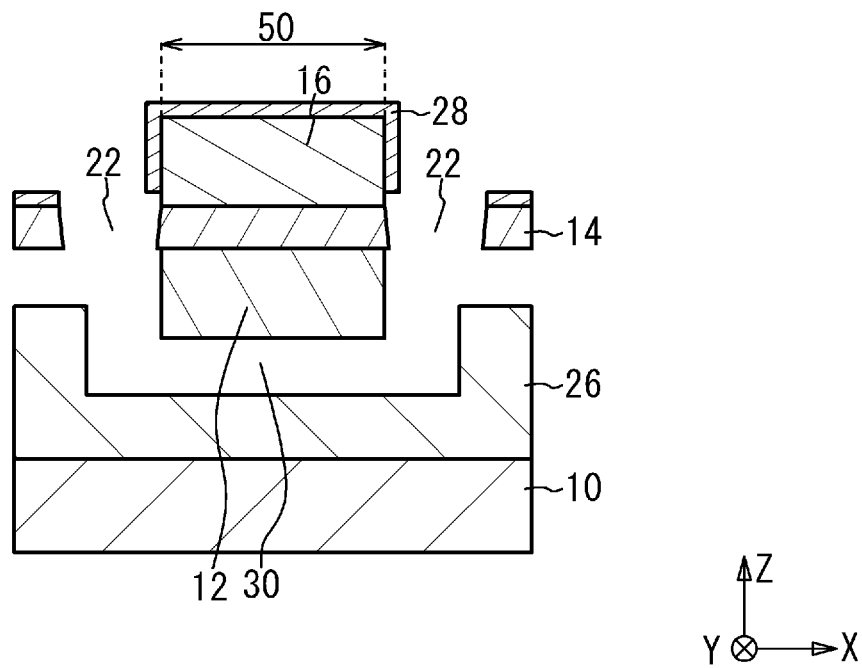
FIG. 12A is a cross-sectional view taken along line A-A in FIG. 11.
Figure 12B:
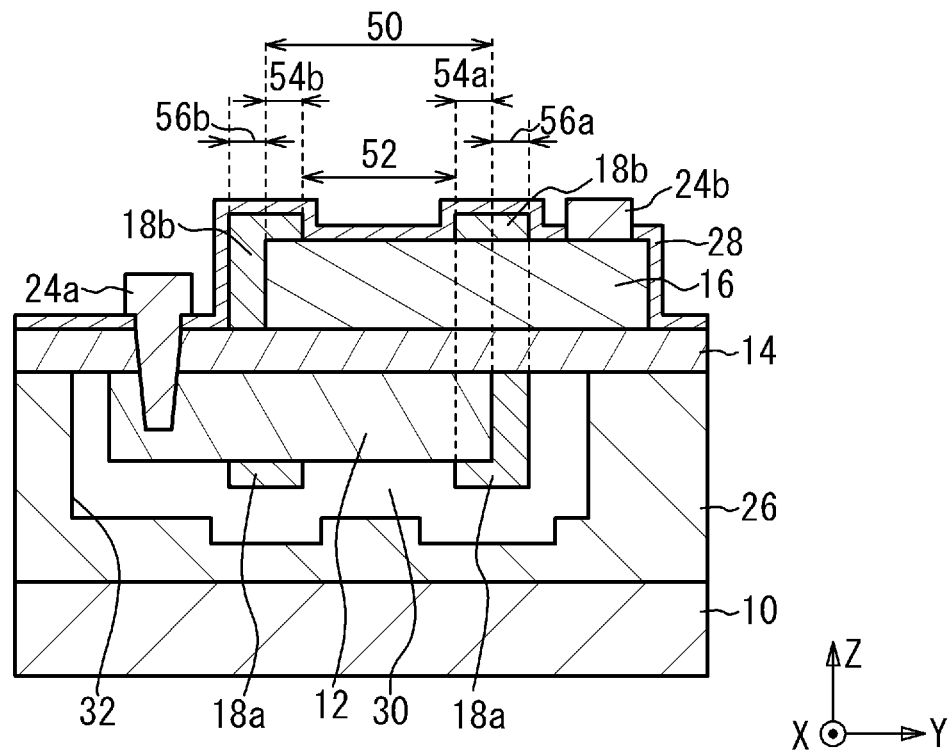
FIG. 12B is a cross-sectional view taken along line B-B in FIG. 11.

FIG. 11 is a plan view of a piezoelectric thin film resonator 200 in accordance with a second embodiment. FIG. 12A is a cross-sectional view taken along line A-A in FIG. 11, and FIG. 12B is a cross-sectional view taken along line B-B in FIG. 11. As illustrated in FIG. 11, FIG. 12A, and FIG. 12B, in the piezoelectric thin film resonator 200 in accordance with the second embodiment, the additional film 18a is provided in each of the edge regions 54a and 54b, which are located on respective sides of the resonance region 50 in the Y direction, in a substantially rectangular shape in a plan view. Similarly, the additional film 18b is provided in each of the edge regions 54a and 54b, which are located on respective sides of the resonance region 50 in the Y direction, in a substantially rectangular shape in a plan view. Other configurations are the same as those in the first embodiment, and the description thereof is thus omitted.

The additional film 18a may be provided only in the edge region 54a as in the first embodiment, or may be provided in the edge region 54a and the edge region 54b as in the second embodiment. Similarly, the additional film 18b may be provided only in the edge region 54b as in the first embodiment, or may be provided in the edge region 54a and the edge region 54b as in the second embodiment.

The second embodiment is not limited to the case in which both of the additional films 18a and 18b are provided, and may be applied to the case in which only one of the additional films 18a and 18b is provided. The positions of the additional films 18a and 18b in the Y direction in the edge regions 54a and 54b are required to have high precision to reduce lateral-mode spurious emissions. To achieve high positional precision, as in the first embodiment, it is preferable that the additional film 18a be provided in the edge region 54a, which is the tip portion of the lower electrode 12, and the additional film 18b be provided in the edge region 54b, which is the tip portion of the upper electrode 16.

Third Embodiment

Figure 13:
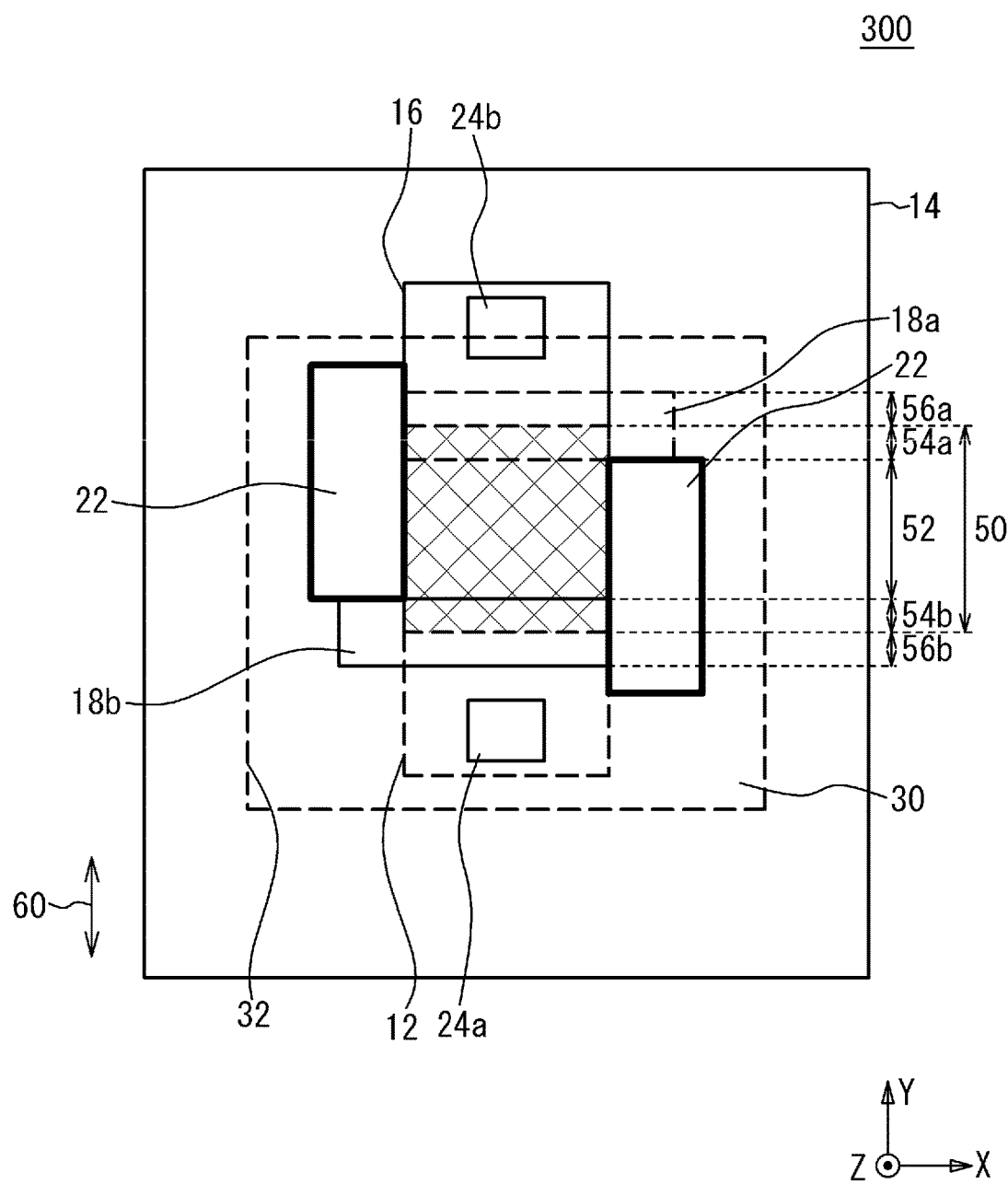
FIG. 13 is a plan view of a piezoelectric thin film resonator in accordance with a third embodiment.

FIG. 13 is a plan view of a piezoelectric thin film resonator 300 in accordance with a third embodiment. As illustrated in FIG. 13, in the piezoelectric thin film resonator 300 in accordance with the third embodiment, the additional film 18a extends from the resonance region 50 in the +X direction, and does not extend from the resonance region 50 in the −X direction. Unlike the additional film 18b, the additional film 18a extends from the resonance region 50 in the −X direction and does not extend from the resonance region 50 in the +X direction. Of a pair of the through holes 22, the through hole 22 located at the +X direction side extends from the resonance region 50 in the −Y direction, and the through hole 22 located at the −X direction side extends from the resonance region 50 in the +Y direction. Other configurations are the same as those in the first embodiment, and the description thereof is thus omitted.

In the third embodiment, the length of each of a pair of the through holes 22 in the Y direction (a second direction) is longer than the length of the resonance region 50 in the Y direction (the second direction). Thus, when an etching medium is introduced into the through holes 22 to remove the sacrificial layer 70, the sacrificial layer 70 can be efficiently removed.

In the third embodiment, the lengths in the Y direction of both of the pair of the through holes 22 are longer than the length in the Y direction of the resonance region 50. However, the length in the Y direction of at least one of the pair of the through holes 22 may be longer than the length in the Y direction of the resonance region 50. In addition, both of the pair of the through holes 22 may extend from the resonance region 50 in the +Y direction or the −Y direction.

Fourth Embodiment

Figure 14A:
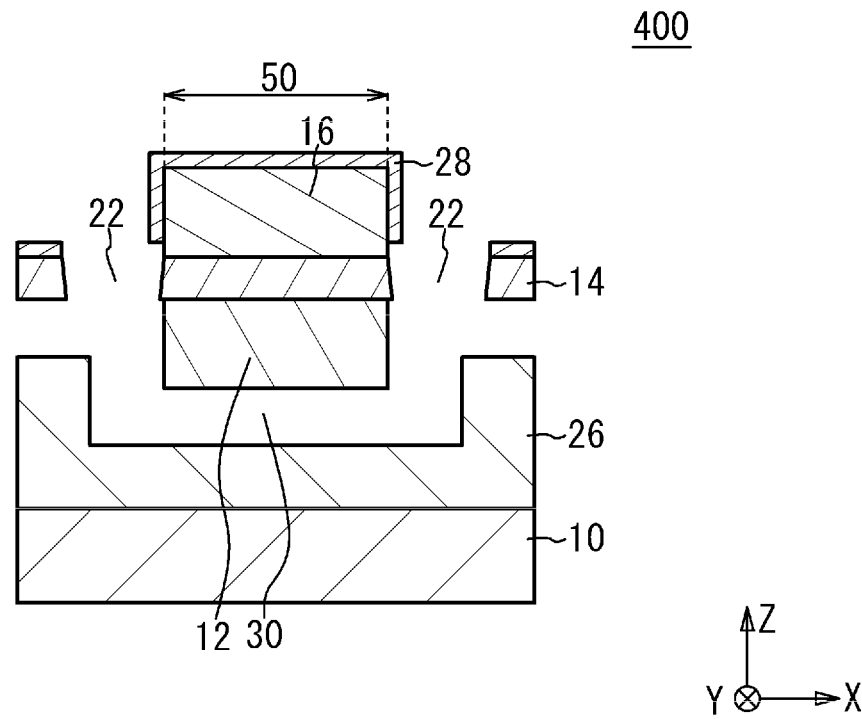
FIG. 14A and FIG. 14B are cross-sectional views of a piezoelectric thin film resonator in accordance with a fourth embodiment.
Figure 14B:
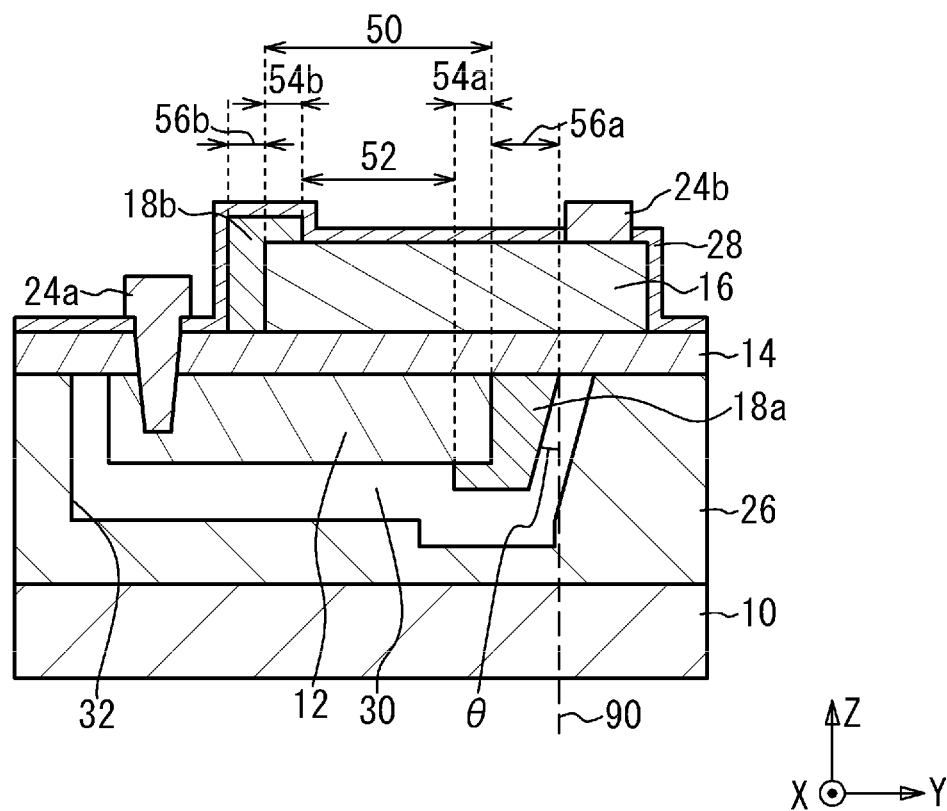

FIG. 14A and FIG. 14B are cross-sectional views of a piezoelectric thin film resonator 400 in accordance with a fourth embodiment. As illustrated in FIG. 14A and FIG. 14B, in the piezoelectric thin film resonator 400 in accordance with the fourth embodiment, the side surface of the additional film 18a is a tapered surface that is inclined so that the additional film 18a becomes wider toward the piezoelectric film 14 in a cross-sectional view. An angle θ of the side surface of the additional film 18a with respect to a normal line 90 of the surface of the piezoelectric film 14 on which the lower electrode 12 is provided is, for example, about 5° to 40°. Other configurations are the same as those in the first embodiment, and the description thereof is thus omitted.

In the fourth embodiment, the side surface of the additional film 18a is a tapered surface that is inclined with respect to the normal line 90 of the surface of the piezoelectric film 14 on which the lower electrode 12 is provided, in a cross-sectional view. It is desirable to thin the sacrificial layer 70 to inhibit the breakage of the piezoelectric film 14. However, when the sacrificial layer 70 is thinned, the sacrificial layer 70 may rupture on the side surface of the additional film 18a. By forming the side surface of the additional film 18a as a tapered surface, it is possible to inhibit the rupture of the sacrificial layer 70.

Fifth Embodiment

Figure 15:
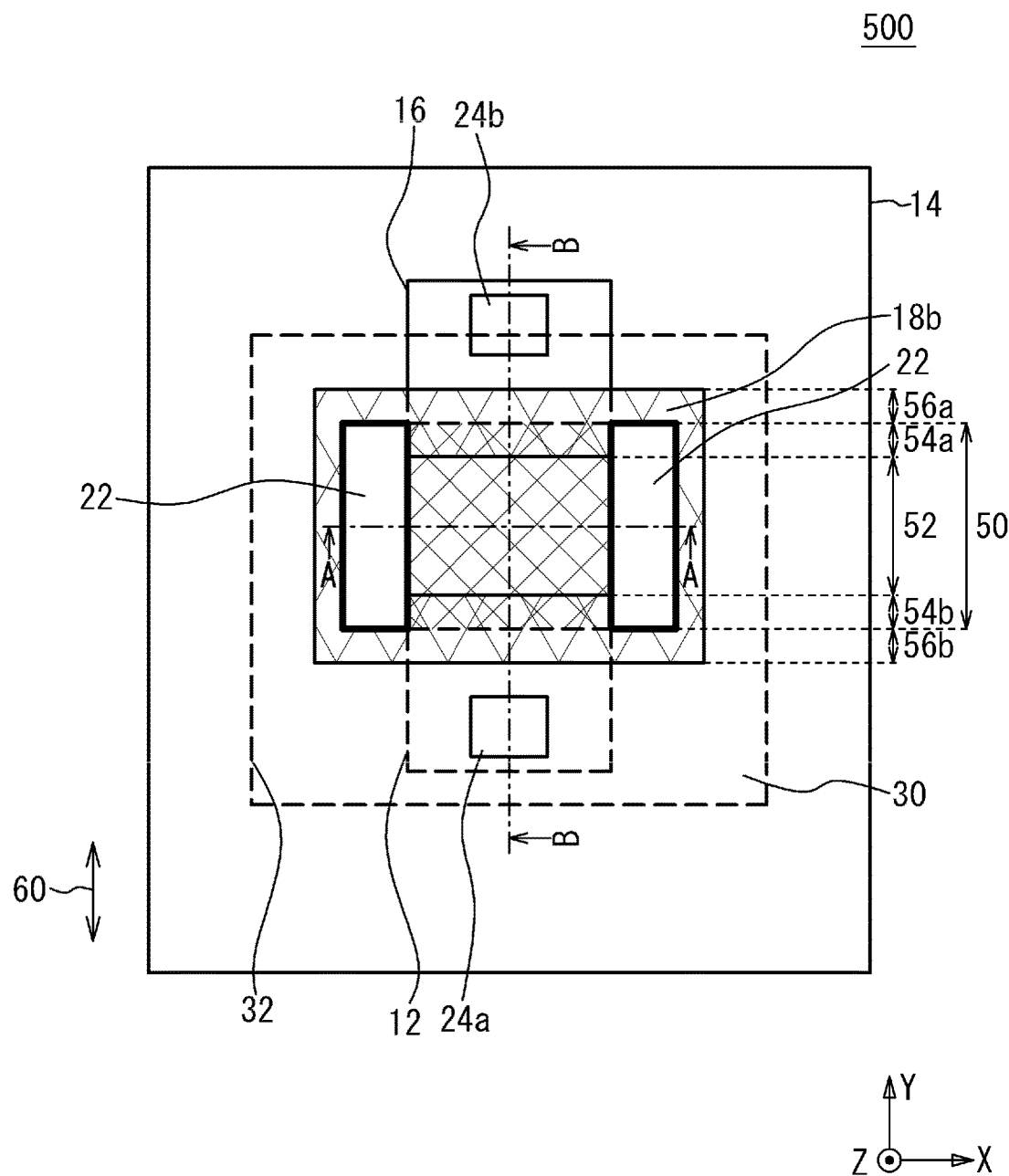
FIG. 15 is a plan view of a piezoelectric thin film resonator in accordance with a fifth embodiment.
Figure 16A:
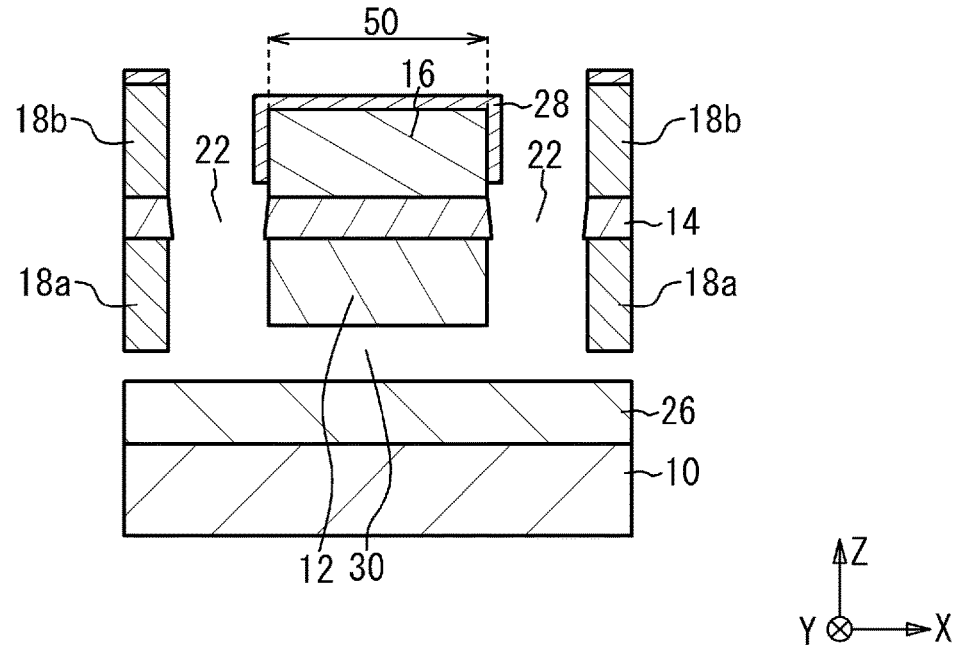
FIG. 16A is a cross-sectional view taken along line A-A in FIG. 15.
Figure 16B:
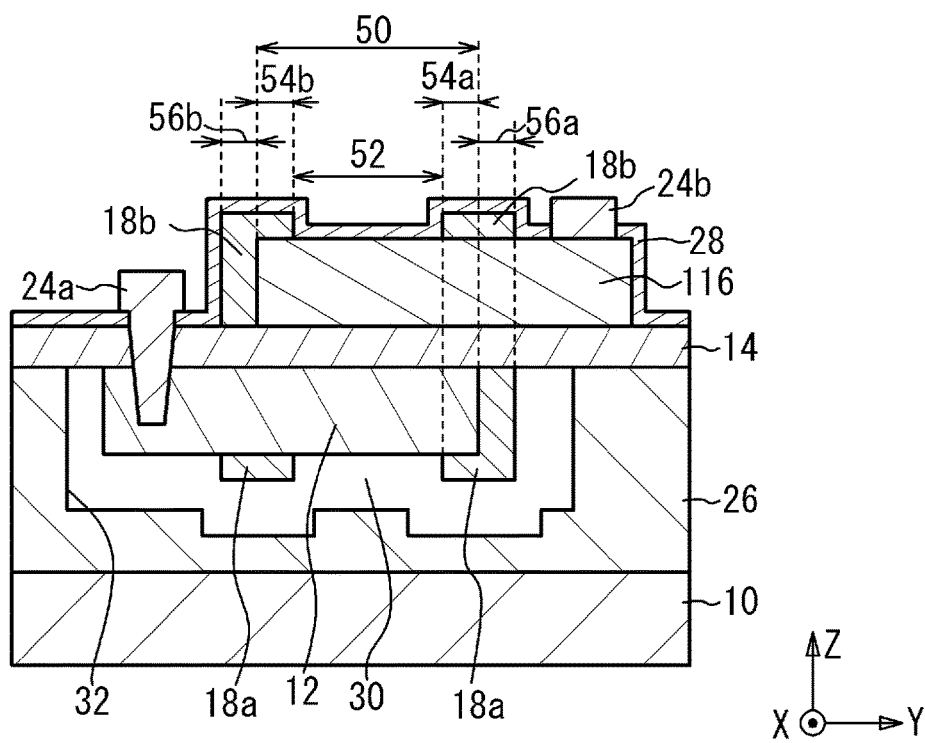
FIG. 16B is a cross-sectional view taken along line B-B in FIG. 15.

FIG. 15 is a plan view of a piezoelectric thin film resonator 500 in accordance with a fifth embodiment. FIG. 16A is a cross-sectional view taken along line A-A in FIG. 15, and FIG. 16B is a cross-sectional view taken along line B-B in FIG. 15. In FIG. 15, for clarity of the drawing, the additional film 18b is also hatched in addition to the resonance region 50. As illustrated in FIG. 15, FIG. 16A, and FIG. 16B, in the piezoelectric thin film resonator 500 in accordance with the fifth embodiment, the additional film 18a is provided in a ring shape under the piezoelectric film 14, and the additional film 18b is provided in a ring shape on the piezoelectric film 14. The through holes 22 are provided inside the ring-shaped additional films 18a and 18b. Other configurations are the same as those in the first embodiment, and the description thereof is thus omitted.

In the fifth embodiment, the additional films 18a and 18b are provided in a ring shape, and the through holes 22 are provided inside the ring-shaped additional films 18a and 18b. Accordingly, it is possible to obtain a structure in which the entire circumference of the resonance region 50 is surrounded by the additional films 18a and 18b and a pair of the through holes 22 in a plan view. Therefore, lateral-mode spurious emissions can be effectively reduced.

The fifth embodiment has described the case in which the additional film 18a is provided under the lower electrodes 12 and the additional film 18b is provided on the upper electrode 16 as an example, but only one of the additional films 18a and 18b may be provided.

The first to fifth embodiments have described the case in which the thickness-shear vibration is excited in the resonance region 50 as an example, but the thickness extension vibration may be excited. In addition, the shape of the resonance region 50 is not limited to a substantially rectangular shape in a plan view, and may be another shape such as a polygonal shape having five or greater apexes or an elliptical shape.

Sixth Embodiment

Figure 17:
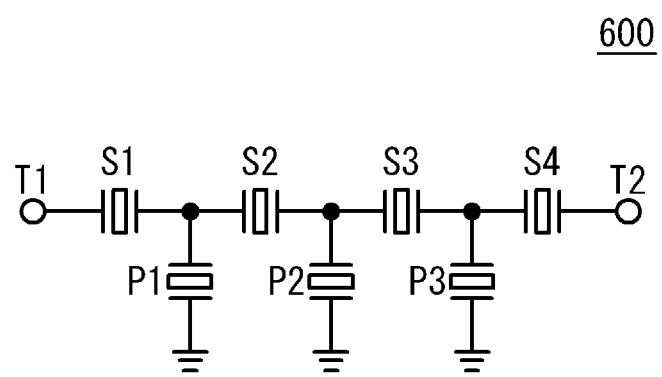
FIG. 17 is a circuit diagram of a filter in accordance with a sixth embodiment.

FIG. 17 is a circuit diagram of a filter 600 in accordance with a sixth embodiment. As illustrated in FIG. 17, in the filter 600, one or more series resonators S1 to S4 are connected in series between an input terminal T1 and an output terminal T2. One or more parallel resonators P1 to P3 are connected in parallel between the input terminal T1 and the output terminal T2. The piezoelectric thin film resonator according to any one of the first to fifth embodiments can be used as at least one of the following resonators: one or more series resonators S1 to S4 and one or more parallel resonators P1 to P3. The number of resonators in the ladder-type filter can be set as appropriate.

Seventh Embodiment

Figure 18:
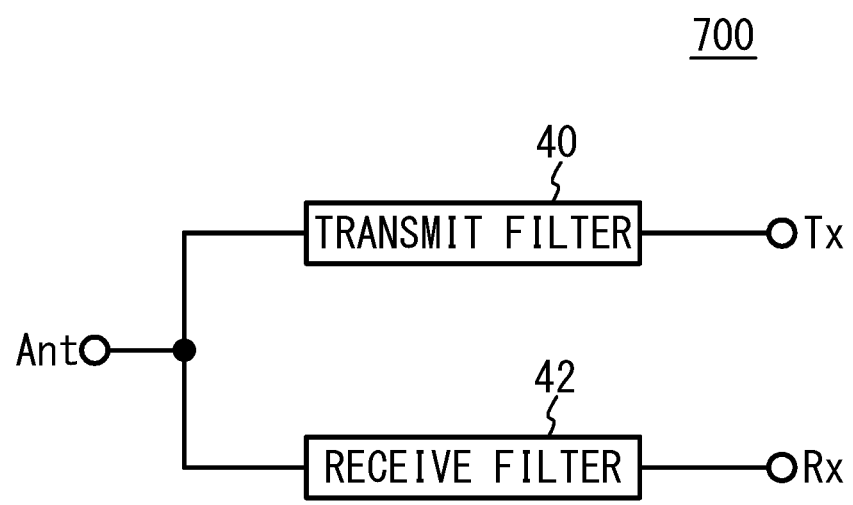
FIG. 18 is a block diagram of a duplexer in accordance with a seventh embodiment.

FIG. 18 is a block diagram of a duplexer 700 in accordance with a seventh embodiment. As illustrated in FIG. 18, in the duplexer 700, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. Either or both of the transmit filter 40 and the receive filter 42 may be the filter 600 of the sixth embodiment.

In the seventh embodiment, a duplexer is described as an example of a multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a substrate;
a lower electrode and an upper electrode provided over the substrate;
a piezoelectric film that is provided over the substrate, at least a part of the piezoelectric film being interposed between the lower electrode and the upper electrode thereby defining a resonance region in a plan view where the lower electrode and the upper electrode overlap with each other across said at least a part of the piezoelectric film, the piezoelectric film having a pair of through holes, the pair of through holes sandwiching the resonance region therebetween in a first direction in the plan view, being provided along the resonance region, and being connected to an air gap, the air gap being formed between the substrate and the lower electrode and overlapping with the resonance region in the plan view; and
additional films that are not provided in a central region of the resonance region in the plan view and that are not provided in entire respective first edge regions, which are located on respective sides of the central region in the first direction in the plan view, of the resonance region, the additional film being provided in respective second edge regions, which are located on respective sides of the central region in a second direction substantially orthogonal to the first direction in the plan view, of the resonance region.

2. The acoustic wave device according to claim 1, wherein the lower electrode and the upper electrode excite thickness-shear vibration in the piezoelectric film, and wherein the second direction is substantially parallel to a vibration direction of the thickness-shear vibration.

3. The acoustic wave device according to claim 1, wherein in the plan view, the resonance region is surrounded by the pair of through holes in the first direction and by the additional films in the second direction, so that a substantially entire circumference of the resonance region is surrounded by the additional films and the pair of through holes.

4. The acoustic wave device according to claim 1, wherein, in the plan view, the pair of through holes are in contact with the resonance region at respective sides of the resonance region in the first direction.

5. The acoustic wave device according to claim 1, wherein the resonance region has a substantially rectangular shape in the plan view, and sides opposite to each other in the first direction of the resonance region are defined by the pair of through holes.

6. A filter comprising:
the acoustic wave device according to claim 1.

7. A multiplexer comprising:
the filter according to claim 6.

8. An acoustic wave device comprising:
a substrate;
a lower electrode and an upper electrode provided over the substrate;
a piezoelectric film that is provided over the substrate, at least a part of the piezoelectric film being interposed between the lower electrode and the upper electrode thereby defining a resonance region in a plan view where the lower electrode and the upper electrode overlap with each other across said at least a part of the piezoelectric film, the piezoelectric film having a pair of through holes, the pair of through holes sandwiching the resonance region therebetween in a first direction in the plan view, being provided along the resonance region, and being connected to an air gap, the air gap being formed between the substrate and the lower electrode and overlapping with the resonance region in the plan view; and
additional films that are not provided in a central region of the resonance region in the plan view and are provided in respective edge regions, which are located on respective sides of the central region in a second direction substantially orthogonal to the first direction in the plan view, of the resonance region, wherein the additional films are longer than the resonance region in the first direction, and wherein at least a part of each of the pair of through holes is sandwiched between the additional films in the second direction in the plan view.

9. An acoustic wave device comprising:

a substrate;

a lower electrode and an upper electrode provided over the substrate;

a piezoelectric film that is provided over the substrate, at least a part of the piezoelectric film being interposed between the lower electrode and the upper electrode thereby defining a resonance region in a plan view where the lower electrode and the upper electrode overlap with each other across said at least a part of the piezoelectric film, the piezoelectric film having a pair of through holes, the pair of through holes sandwiching the resonance region therebetween in a first direction in the plan view, being provided along the resonance region, and being connected to an air gap, the air gap being formed between the substrate and the lower electrode and overlapping with the resonance region in the plan view; and additional films that are not provided in a central region of the resonance region in the plan view and are provided in respective edge regions, which are located on respective sides of the central region in a second direction substantially orthogonal to the first direction in the plan view, of the resonance region, wherein the additional films are provided in a ring shape on at least one of the following surfaces: a first surface of the piezoelectric film on which the lower electrode is provided and a second surface of the piezoelectric film on which the upper electrode is provided, and wherein the pair of through holes are provided inside the ring-shaped additional films.

* * * * *